United States Patent [19]

Tomono

[11] Patent Number: 4,625,137

[45] Date of Patent: Nov. 25, 1986

[54] PIEZOELECTRIC ACTUATOR USING BIMORPH ELEMENT

[75] Inventor: Akira Tomono, Kanagawa, Japan

[73] Assignee: Nippon Telegraph & Telephone Public Corp., Japan

[21] Appl. No.: 678,482

[22] Filed: Dec. 5, 1984

[30] Foreign Application Priority Data

| Dec. 9, 1983 | [JP] | Japan | 58-232442 |
|---|---|---|---|
| Mar. 9, 1984 | [JP] | Japan | 59-43881 |
| Apr. 14, 1984 | [JP] | Japan | 59-75623 |
| Apr. 27, 1984 | [JP] | Japan | 59-83700 |
| Jun. 11, 1984 | [JP] | Japan | 59-118257 |
| Jul. 23, 1984 | [JP] | Japan | 59-152563 |
| Aug. 10, 1984 | [JP] | Japan | 59-167328 |
| Dec. 3, 1984 | [JP] | Japan | 59-254243 |

[51] Int. Cl.$^4$ .................................. H01L 41/08
[52] U.S. Cl. .................................. 310/317; 310/330; 310/332
[58] Field of Search ............... 310/317, 332, 330, 331; 200/181; 335/170, 196

[56] References Cited

U.S. PATENT DOCUMENTS

| 3,760,203 | 9/1973 | Guntersdorfer et al. | 310/317 |
|---|---|---|---|
| 3,794,410 | 2/1974 | Elliott | 310/332 X |
| 3,821,747 | 6/1974 | Mason | 310/332 X |
| 4,099,211 | 7/1978 | Hathaway | 310/317 X |
| 4,237,399 | 12/1980 | Sakamoto | 310/317 |
| 4,458,171 | 7/1984 | Kolm et al. | 310/332 X |

FOREIGN PATENT DOCUMENTS

| 2852795 | 6/1979 | Fed. Rep. of Germany | 310/332 |
|---|---|---|---|
| 961606 | 6/1964 | United Kingdom | 310/332 |

*Primary Examiner*—Mark O. Budd
*Attorney, Agent, or Firm*—Remy J. VanOphem

[57] ABSTRACT

A piezoelectric actuator using a bimorph element, comprises:

a bimorph element having at least one pair of piezo elements respectively on two surfaces of a central electrode and an electrode formed on a surface of each piezo element which is opposite to a surface contacting the central electrode, the piezo elements formed on the two surfaces of the central electrode being polarized in the same direction with respect to a direction of thickness of the bimorph element;

a drive input circuit arranged such that a cathode of a first directional voltage limiting circuit is connected to one electrode contacting a positively polarized surface of the piezo element whose negatively polarized surface contacts the central electrode, that an anode of a second directional voltage limiting circuit is connected to the other electrode contacting a negatively polarized surface of the piezo element whose positively polarized surface contacts the central electrode, that an anode of the first directional voltage limiting circuit and a cathode of the second directional voltage limiting circuit are commonly connected to constitute one drive input terminal, and that the central electrode serves as the other drive input terminal;

a constant voltage source for applying a constant voltage to the drive input circuit; and a polarity switching circuit, arranged between the constant voltage source and the drive input circuit, for switching a polarity of the constant voltage source with respect to the one and the other drive input terminals of the drive input circuit.

21 Claims, 49 Drawing Figures

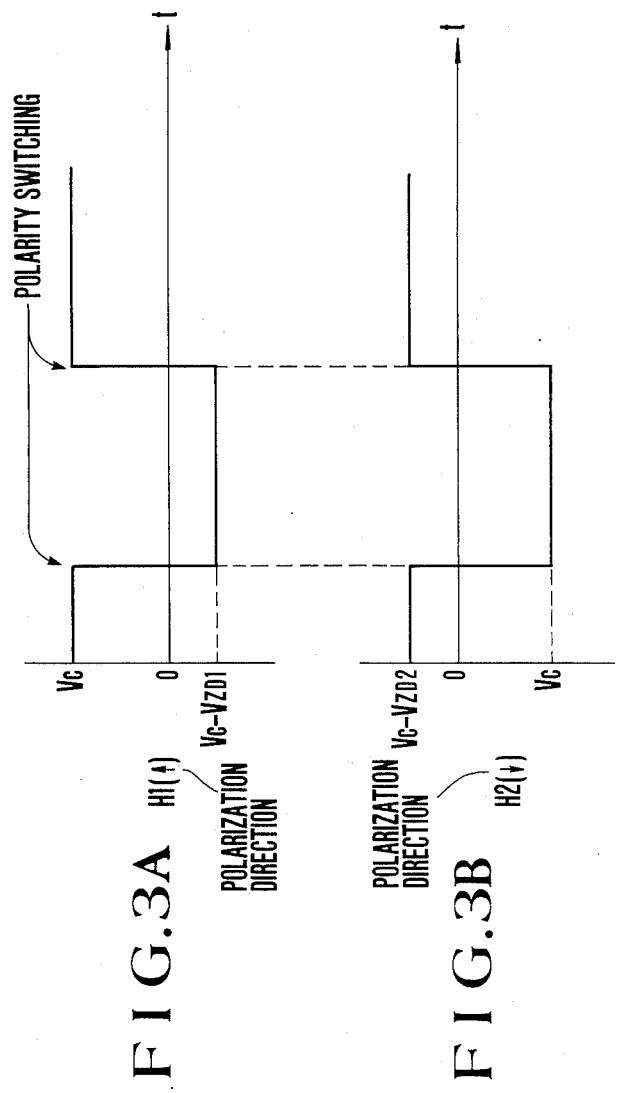

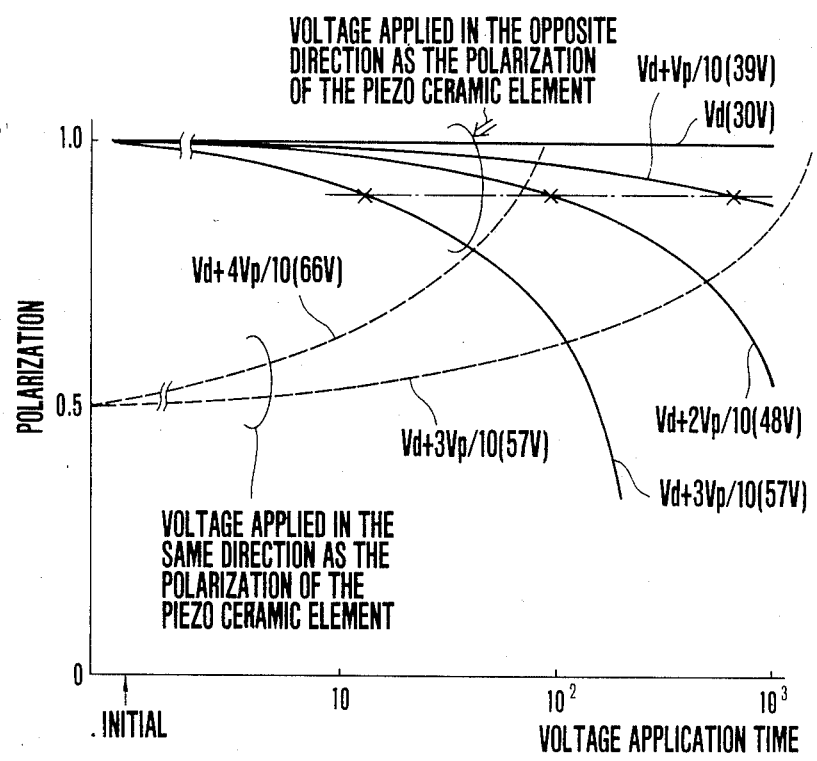
F I G. 4A

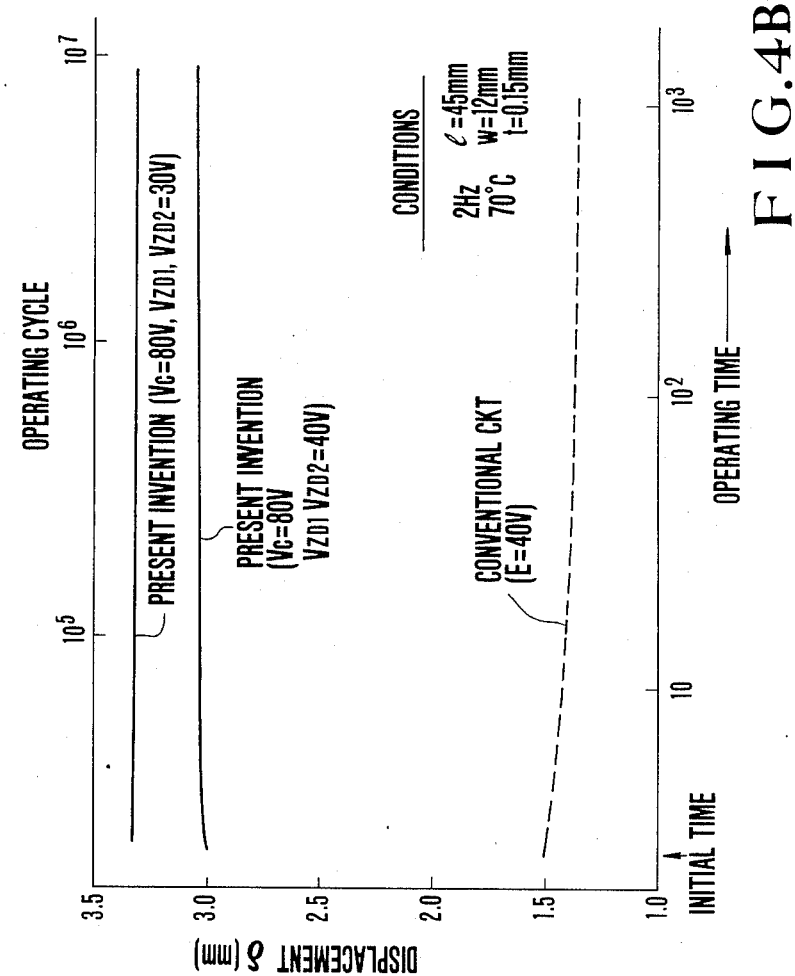

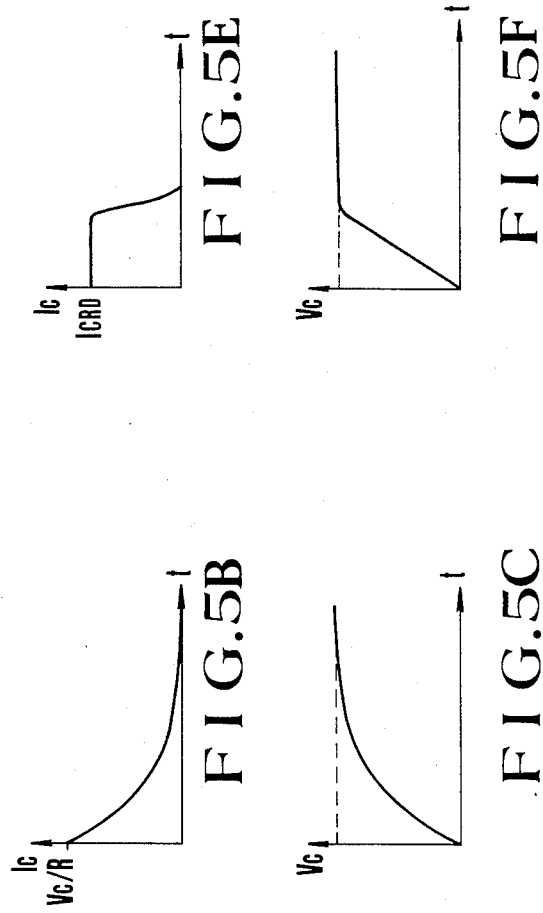

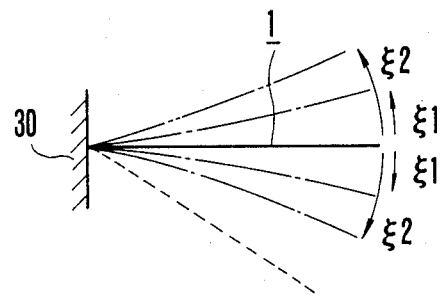
F I G. 17
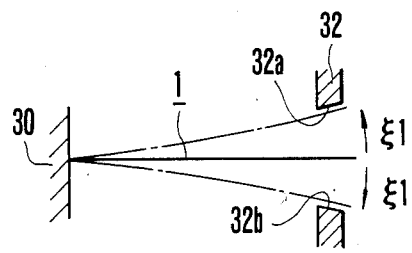
F I G. 18

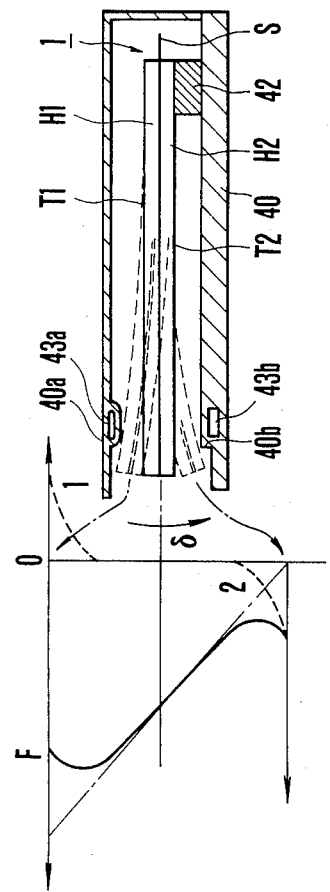
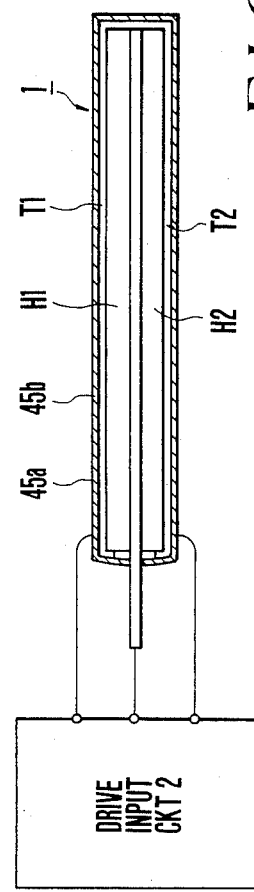
FIG.19    FIG.20    FIG.21

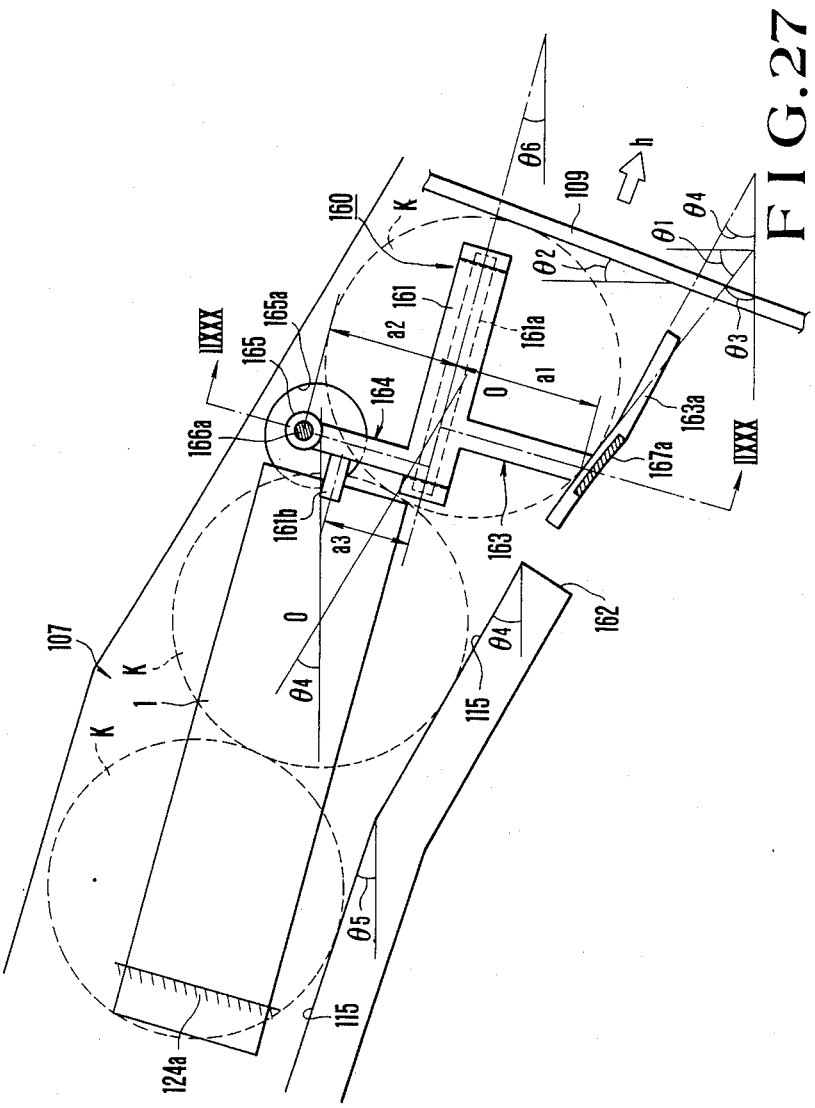

PIEZOELECTRIC ACTUATOR USING BIMORPH ELEMENT

BACKGROUND OF THE INVENTION

The present invention relates to a bimorph element and, more particularly, to a piezoelectric actuator using a unidirectional polarization type bimorph element.

Compact, light-weight, low-power telephone terminal devices have been recently developed, and demand has arisen for the development of highly effective drive components. Conventional drive components have been electromagnets. However, an electromagnet generates only a small force at the initial stage of its operation and requires a spring to restore the initial state, thereby degrading efficiency. The conventional drive unit using the electromagnet cannot satisfy requirements of compactness and low power consumption. For this reason, a coin processing apparatus requiring a telephone station power source results in large size and high cost.

A compact, thin, low-power drive component may comprise a known PZT (trade name) bimorph element available from Krebeit Inc. However, a conventional PZT bimorph element provides only a small displacement and a small force. A power of up to 10 mW is required to hold a switching state of a driver so as to keep the bimorph element displaced at one side upon application of a voltage thereto. In addition to these disadvantages, this bimorph element has a large hysteresis and a low resistance to mechanical impact and cannot be used in the coin processing apparatus.

In the PZT bimorph element, two piezoceramic elements, i.e., piezoelectric plates which consist of lead zirconate-titanate and which are polarized along the direction of thickness thereof are overlapped. One end of each of the piezoceramic elements is fixed. Under these conditions, a voltage having the same polarity as the polarization of the piezoceramic elements is applied to one piezoceramic element, and a voltage having a polarity opposite to the polarization of the piezoceramic elements is applied to the other piezoceramic element. In other words, an electric field acting along the direction of thickness is applied to the respective piezoceramic elements which are displaced along opposing directions in accordance with a piezoelectric transverse displacement effect, thereby flexing the free end portions thereof.

Conventional bimorph elements are classified into a parallel type element wherein the overlapping piezoceramic elements are polarized in one direction with respect to the direction of thickness thereof, and a series type wherein the overlapping piezoceramic elements are polarized in opposing directions with respect to the direction of thickness thereof. The parallel type element can provide a large displacement at a low voltage and can be used in place of the electromagnet.

However, as described above, a voltage is applied to one piezoceramic element in the same direction as the polarization of the elements, and another voltage is applied to the other piezoceramic element in a direction opposite to the polarization, thereby displacing the free ends along a given direction. Thereafter, the polarities of the applied voltages are switched to restore the initial polarization states of the piezoceramic elements. Although the above operation must be repeated, in the piezoceramic element with the applied voltage having a polarity opposite to its polarization direction, the polarization effect becomes weakened. Since a piezoelectric actuator must provide a maximum displacement, a power source voltage must be increased. However, if a bimorph element comprises two piezoceramic elements each of which has a thickness of about 0.15 mm and whose material has a field strength of 580 V/mm, when the power source voltage increases to about 80 V to 85 V, the polarization of the piezoceramic elements is disturbed, and the resultant displacement becomes very small. A practical applied voltage is limited to $\frac{1}{2}$ to $\frac{1}{3}$ of the polarization breakdown voltage. For example, in this parallel type element, a displacement of about 1 mm in a bimorph element having a length of 45 mm is obtained at a voltage of 30 V. In this manner, when a conventional drive circuit is used although the parallel type element is used, a large displacement cannot be obtained since the power source voltage is limited.

A polarity switching circuit must have electrical characteristics wherein a high voltage can be switched, a switched state can be held at a low power, and carriers charged by the bimorph element at the time of switching can be immediately discharged. However, none of the conventional switching circuits can satisfy these electrical characteristics.

In addition, when the bimorph element is used as an actuator for coil processing, a large impact acts on the distal end of the bimorph element as an operating end and the piezoceramic elements may often be damaged. Conventional mechanisms for protecting the elements from damage have not been substantially proposed.

SUMMARY OF THE INVENTION

It is, therefore, a principal object of the present invention to provide a piezoelectric actuator using a bimorph element wherein a large displacement can be obtained with a large force at a low power without depolarizing piezoceramic elements of the bimorph element.

In order to achieve the above object of the present invention, there is provided a piezoelectric actuator using a bimorph element, comprising:

a bimorph element having at least one pair of piezo elements respectively on two surfaces of a central electrode and an electrode formed on a surface of each piezo element which is opposite to a surface contacting the central electrode, the piezo elements formed on the two surfaces of the central electrode being polarized in the same direction with respect to a direction of thickness of the bimorph element;

a drive input circuit arranged such that a cathode of a first directional voltage limiting circuit is connected to one electrode contacting a positively polarized surface of the piezo element whose negatively polarized surface contacts the central electrode, that an anode of a second directional voltage limiting circuit is connected to the other electrode contacting a negatively polarized surface of the piezo element whose positively polarized surface contacts the central electrode, that an anode of the first directional voltage limiting circuit and a cathode of the second directional voltage limiting circuit are commonly connected to constitute one drive input terminal, and that the central electrode serves as the other drive input terminal;

a constant voltage source for applying a constant voltage to the drive input circuit; and a polarity switching circuit, arranged between the constant voltage source and the drive input circuit, for switching a polarity of the constant voltage source with respect to the one and the other drive input terminals of the drive input circuit.

BRIEF DESCRIPTION OF THE DRAWINGS

FIGS. 3A and 3B are respectively timing charts showing drive voltages applied to piezoceramic elements of the bimorph element;

FIG. 4A is a graph for explaining depolarization and polarization effects;

FIG. 4B is a graph showing the relationship between displacement and operating time characteristics of the bimorph element shown in FIG. 1;

FIGS. 5A to 5F are respectively schematic diagrams of modifications using constant current diodes;

FIGS. 17 and 18 are representations for explaining necessity of limitating a displacemnet range of the bimorph element and its principle, respectively;

FIG. 19 is a sectional view of a piezoelectric actuator exemplified on the basis of the principle represented in FIG. 18;

FIG. 20 is a graph showing the relationship between the generated force and displacement characteristics so as to explain the operation of the piezoelectric actuator in FIG. 19;

FIG. 21 is partially cutaway side sectional view of a modification of the bimorph element according to the present invention;

FIG. 27 is a representation showing the principle wherein the piezoelectric actuator according to the present invention is applied to another coin processing apparatus;

FIGS. 30A to 30C are respectively graphs showing the relationships between the generated force and the displacement so as to explain the operation of the actuator in FIG. 27;

DESCRIPTION OF THE PREFERRED EMBODIMENTS

Figure 1:
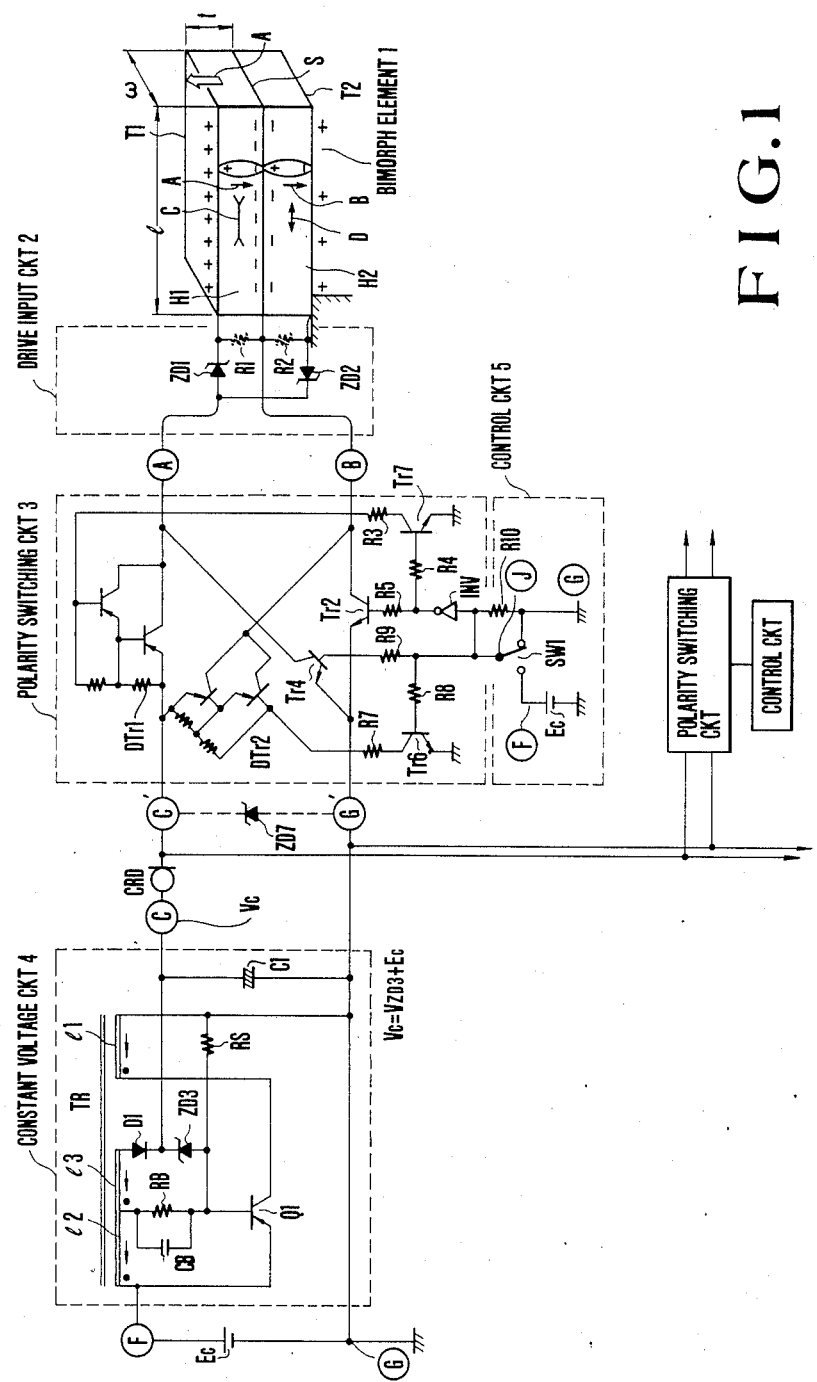
FIG. 1 is a circuit diagram of a piezoelectric actuator using a bimorph element according to an embodiment of the present invention.

FIG. 1 shows a piezoelectric actuator using a bimorph element according to an embodiment of the present invention. Referring to FIG. 1, this piezoelectric actuator basically comprises a parallel type bimorph element 1, a drive input circuit 2, a polarity switching circuit 3, a constant voltage circuit 4, a control circuit 5 and a DC power source $E_C$. The bimorph element 1 is connected to the DC power source $E_C$ through the drive input circuit 2, the polarity switching circuit 3 and the constant voltage circuit 4. The bimorph element 1 includes a pair of piezoceramic elements H1 and H2. These piezoceramic elements H1 and H2 sandwich a central electrode S and are arranged such that their polarization directions are the same (upper-to-lower direction of thickness in FIG. 1). Electrodes T1 and T2 are formed on surfaces of the piezoceramic elements H1 and H2 which oppose the inner surfaces thereof contacting the central electrode S. One end of the electrode T2 formed on the piezoceramic element H2 is connected to a base.

The drive input circuit 2 comprises: a Zener diode ZD1, i.e., a constant voltage diode, a cathode of which is connected to the electrode T1 of the piezoceramic element H1; a Zener diode ZD2, an anode of which is connected to the electrode T2 of the piezoceramic element H2; a resistor R1 of a high resistance connected between the electrode T1 and the middle electrode S; and a resistor R2 of a high resistance connected between the central electrode S and the electrode T2. The remaining terminals of the Zener diodes ZD1 and ZD2 are commonly connected, and a common junction point is connected to a terminal A. A junction point (i.e., the central electrode S) between the resistors R1 and R2 is connected to a terminal B. The resistors R1 and R2 may be omitted, as indicated by dotted lines.

The polarity switching circuit 3 comprises: a Darlington-connected pnp transistor pair DTr1, an output of which is connected between the terminal A and a terminal C'; a Darlington-connected pnp transistor pair DTr2, an output of which is connected between the terminal B and the terminal C'; an NPN transistor TR2, an output of which is connected between the terminal B and a terminal G'; and an NPN transistor Tr4 an output of which is connected between the terminal B and the terminal G'. These transistors are bridged as a polarity switch. The input electrode (base) of the transistor pair DTr1 is connected to the collector of an NPN transistor Tr7 through a resistor R3. The emitter of the NPN transistor Tr7 is grounded. The base of the transistor Tr7 is connected to an output terminal of an inverter INV through a resistor R4. The emitter of the transistor Tr2 is connected to the output terminal of the inverter INV through a resistor R5.

The input electrode (base) of the transistor pair DTr2 is connected to the collector of an NPN transistor Tr6 through a resistor R7. The emitter of the NPN transistor Tr6 is grounded The base of the transistor Tr6 is connected to the input terminal of the inverter INV through a resistor R8 and to the control circuit 5. The base of the transistor Tr4 is also connected to the input terminal of the inverter INV through a resistor R9. The control circuit 5 causes a combination of the transistor pair DTr1 and the transistor Tr2 and a combination of the transistor pair DTr2 and the transistor Tr4 in the polarity switching circuit 3 to be alternately switched to control polarity switching of the voltage applied to the bimorph element 1. The control circuit 5 comprises a resistor R10, a switch SW1 and a DC power source $E_C$. The input terminal of the inverter INV is grounded through a resistor R10. At the same time, this input terminal is connected to the positive terminal of the DC power source $E_C$ through a slider of the switch SW1 or is grounded.

The constant voltage circuit 4 comprises: a self-excited ringing choke DC/DC converter using a PNP transistor. The constant voltage circuit 4 comprises a saturating transformer TR having coils 11, 12 and 13 which are wound in the same direction; a capacitor CB and an electrolytic capacitor C1; resistors RB and RS, a PNP transistor Q1, a diode D1 and a Zener diode ZD3. The transistor Q1 together with one end of the coil 12 is connected to a positive terminal F of the DC power source $E_C$. The collector of the transistor Q1 is connected to one terminal of the coil 11. The other terminal of the coil 12 and one terminal of the coil 13 are commonly connected, and this common junction point is connected to the base of the transistor Q1 through a parallel circuit of the capacitor CB and the resistor RB. The base of the transistor Q1 is also connected to the other terminal of the coil 11 through the start resistor RS and to a ground terminal G. The base of the transistor Q1 is further connected to the anode of the Zener diode ZD3. The cathode of the Zener diode ZD3 is connected to an output terminal C. The capacitor C1 is connected between the output terminal C and the ground terminal G. The cathode of a diode D1 is connected to the cathode of the Zener diode ZD3. The anode of the diode D1 is connected to the other terminal of the coil 13. It should be noted that the DC power source $E_C$ generates a voltage of, for example, 5 V. The relationships between $V_C$, $V_{ZD1}$ and $V_{ZD2}$ are given as follows:

$V_C >$ (polarization degradation voltages of the piezoceramic elements H1 and H2)    (1)

$V_C - V_{ZD1}, V_C - V_{ZD2} \leq V_C - V_P/10$    (2)

$V_C - V_{ZD1}, V_C - V_{ZD2} \leq 9 V_P/10$    (3)

Figure 2:
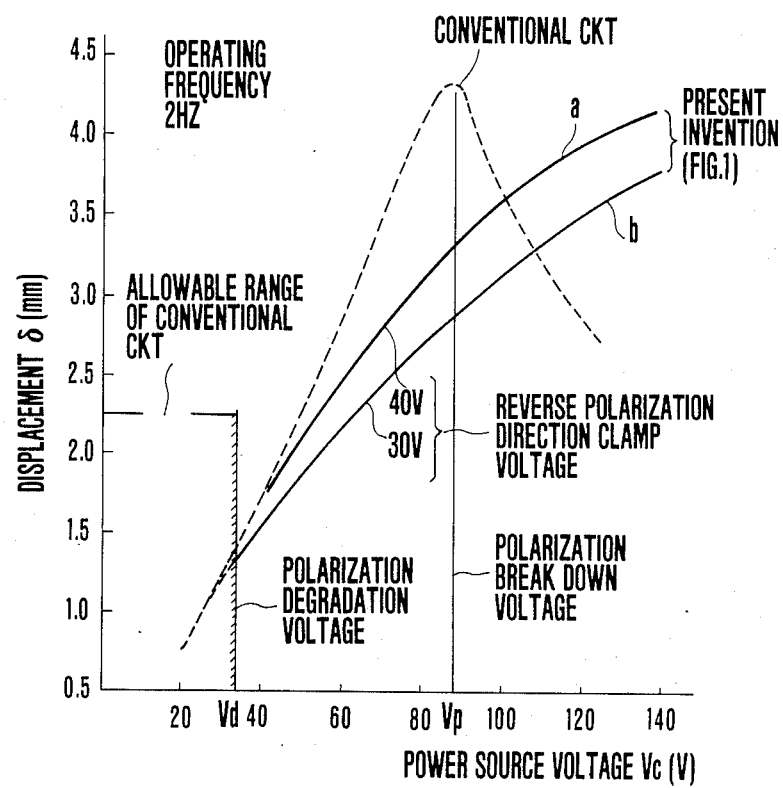
FIG. 2 is a graph showing the relationship between the displacement and drive voltage characteristics of the bimorph element.

In general, the polarization degradation voltage is defined as a voltage at which the piezoceramic element is depolarized when a voltage having a polarity opposite to the polarization of the piezoceramic element is gradually increased. The polarization degradation voltage will be further clarified with reference to FIG. 2. In a conventional parallel type piezoelectric element, an AC power source is connected between the opposing electrodes which are commonly connected to the central electrode of the bimorph element, and a displacement $\delta$ is measured when the AC voltage E (+E to −E) is gradually increased to displace the bimorph element. As indicated by a dotted line in FIG. 2, the displacement is increased in accordance with an increase in voltage. However, when a voltage level exceeds a predetermined level, the displacement is abruptly decreased, as previously described. This is because the polarization of the piezoceramic element is broken down upon application of an excessive voltage having a polarity opposite to the polarization of the piezoceramic element. The voltage subjected to polarization breakdown is termed a polarization breakdown voltage $V_P$. The polarization degradation voltage Vd is ½ to ⅓ of the breakdown voltage $V_P$ of the piezoceramic element of the PZT system. Referring to FIG. 2, since the polarization breakdown voltage is 80 to 85 V, the polarization degradation voltage Vd becomes about 27 to 40 V.

The operation of the constant voltage circuit 4 in FIG. 1 will be described. When a voltage (i.e., 5 V) is applied from the DC power source $E_C$ upon the ON operation of a switch (not shown), a current flows through the start resistor in the constant voltage circuit 4, so that the transistor Q1 is turned on. When a collector current from the transistor Q1 flows through the coil 11 in the transformer T1, an induction voltage is generated through the coils 12 and 13, as shown in FIG. 1, so that a current flows through the base circuit consisting of the resistor RB and the capacitor CB. The ON state of the transistor Q1 is stabilized, and a larger collector current flows out therefrom. When the magnetic fluxes of the coils of the transformer TR become saturated, the induction voltage at the coil 11 becomes low and the base current no longer flows. Therefore, the collector current, i.e., a current flowing through the coil 11 becomes small, and induction voltages at the coils 12 and 13 are inverted. The voltage at the coil 13 is applied to the capacitor C1 which is then charged. By this current, the magnetic fluxes of the coils 12 and 13 are decreased, and the inverted induction voltages become low. A current flows through the coil 12 again from the power source $E_C$ to the base circuit consisting of the resistor RB and the capacitor CB serving for the transistor Q1. The transistor Q1 is turned on, and the coils 11, 12 and 13 are again excited. In this manner, the transformer TR is self-excited, and carriers are charged in the capacitor C1. When the voltage at the capacitor C1 has reached $E_C + V_{ZD3}$, the Zener diode ZD3 is turned on, and a current will not flow in the base circuit consisting of the resistor RB and the capacitor CB, thereby stopping oscillation. When a load is connected and the voltage at the capacitor C1 decreases, oscillation is restarted, thereby obtaining a voltage of $E_C + V_{ZD3}$. As a result, the voltage from the power source $E_C$ is boosted to obtain the constant voltage $V_C$.

The operation of the polarity switching circuit 3 will be described. When the control circuit causes the switch SW1 to set in the position as illustrated in FIG. 1, the output from the inverter INV becomes the same as the voltage from the power source $E_C$. In this state, the transistor Tr2 and then the transistor Tr7 are turned on, so that the Darlington transistor pair DTr1 is turned on In effect, since the Darlington transistor pair DTr1 and the transistor Tr2 connected in parallel in the bridge network are turned on, the voltage $V_C$ appears across the terminals A and B. In this case, since the Zener diode ZD1 is forward biased, the voltage $V_C$ having the same polarity as the polarization is applied to the piezoceramic element H1, so that the piezoceramic element H1 is greatly compressed (FIG. 3A), as shown in FIG. 1. However since the Zener diode ZD2 is reverse biased, a divided voltage $V_C - V_{ZD2}$ having a polarity opposite to the polarization direction is applied to the piezoceramic element H2 which is elongated (FIG. 3B). For this reason, when one end of the bimorph element 1 is fixed, the distal end portion is greatly displaced in the arrowed direction A. When the voltage $V_C - V_{ZD2}$ is lower than the polarization degradation voltage Vd, the piezoceramic element H2 will not be substantially depolarized.

When a reverse-biased Zener diode is connected in series with the piezoceramic element, the power source voltage is divided, and its principle will be briefly described. The bimorph element comprises a capacitive load. In this sense, each piezoceramic element can be regarded as a capacitor $C_{PZ}$ of 0.01 to several microfarads. The reverse bias voltage of the Zener diode is not more than $V_{ZD}$ and the Zener diode is thus kept in the OFF state. In this state, the Zener diode can be regarded as a capacitor $C_{ZD(OFF)}$ of several tens of picofarads to several hundreds of picofarads. However, when the reverse bias voltage exceeds the voltage $V_{ZD}$, the Zener diode is regarded as a conductor. For this reason, when a constant voltage $V_C$ is applied to a series circuit of the piezoceramic element and the Zener diode through a resistor or a constant current diode CRD, condition $C_{PZ} \gg C_{ZD(OFF)}$ is established when a charge current starts to flow. Therefore, most of the voltage applied to the series circuit of the piezoceramic element and the Zener diode is applied to the Zener diode. When a voltage at the series circuit has reached the voltage $V_{ZD}$, the Zener diode is turned on. Thereafter, the piezoceramic element is charged with a voltage $V_C - V_{ZP}$. As is apparent from the above description, the reverse-biased OFF capacitance of the constant voltage circuit used in the present invention must be smaller than the capacitance of the piezoceramic element.

When the switch SW1 in the control circuit 5 is connected to the power source $E_C$, the base currents are cut off from the Darlington transistor pair DTr1 and the transistor Tr2. However, the transistor Tr6, the Darlington transistor pair DTr2 and the transistor Tr4 are turned on. For this reason, a charge current flows from the constant voltage circuit 4 to the bimorph element 1 through a constant current diode CRD. In this case, since the Zener diode ZD2 is forward biased, the voltage $V_C$ is applied to the piezoceramic element H2 along the polarization direction. However, a voltage $V_C - V_{ZD1}$ is applied to the piezoceramic element H1 along a direction opposite to the polarization direction since the Zener diode ZD1 is reverse biased. The distal end of the bimorph element 1 is greatly moved downward. By operating the switch SW1 in the manner described above, the distal end of the bimorph element 1 vertically vibrates. A displacement of the bimorph element 1 is represented by the solid line in FIG. 2 when the voltages $V_C - V_{ZD1,2}$ are kept constant and the voltage $V_C$ changes. In FIG. 2, curves a and b represent the displacements when the clamp voltages having a polarity opposite to the polarization direction are 40 V and 30 V, respectively. In this case, the oscillation frequency was 2 Hz. Unlike the conventional circuit wherein the power source voltage cannot exceed the voltage Vd (about 30 V), when the power source voltage of 70 to 80 V is applied to the bimorph element of the present invention, the displacement is doubly increased. The displacement can be tripled at a voltage of 90 to 100 V. This voltage range can be used in practice. The force can be increased at the same rates as described above, so that the a product of the displacement and the generated force in the actuator is improved 4 to 6 times.

The reason for inclusion of a case wherein in the present invention the voltage $V_C - V_{ZD}$ is higher than the polarization degradation voltage Vd (see equations (2) and (3)) is due to the following.

One of the main features of the present invention lies in the fact that a constant voltage $V_C$ higher than the polarization degradation voltage Vd is applied in the same direction as the polarization direction of the piezoceramic element to recover depolarization caused by application of a voltage in a direction opposite to the polarization direction, thereby preventing degradation of the polarization of the bimorph element. This recovery effect (utilization of an increase in polarization) is not conventionally known well. In order to demonstrate the novelty of the present invention, the recovery effect will be described in detail hereinafter. Predetermined voltages are respectively applied to piezoceramic elements which constitute parallel bimorph elements in a direction opposite to the polarization direction of the piezoceramic elements. Thereafter, the bimorph elements are driven once by using a conventional AC power source. The solid curves in FIG. 4A show displacements of these bimorph elements when the actual displacements are normalized by the initial values thereof. Each piezoceramic element has a polarization breakdown voltage Vp of about 85 V and a polarization degradation voltage Vd of about 30 V. As is apparent from FIG. 4A, a time required for attenuating the vibrations of each bimorph element by a predetermined value is shortened by about Vp/10, as indicated by an intersection between the corresponding solid curves and the alternate long and short dashed line, every time the voltage applied to each piezoceramic element in the direction opposite to its polarization direction increases from the polarization degradation voltage Vd by about 1/10. The recovery effect obtained by an increase in polarization upon application of a voltage higher than the voltage Vd to the depolarized piezoceramic element in the same direction as the polarization direction for a predetermined period is represented by dotted curves. For example, in the piezoceramic element wherein polarization is attenuated by 50% upon application of a voltage Vd+3Vp/10 (≈57 V) for a predetermined period of time, it takes about 10 times the original period of time to recover its polarization when the same voltage is applied in the same direction as its polarization direction. However, when a voltage Vd+4Vp/10 (=66 V) is applied to this depolarized piezoceramic element, it recovers the polarization state within substantially the same period of time as the depolarization time. Therefore, this polarization effect is utilized to prevent degradation of the polarization of the piezoceramic element when a sufficiently high voltage can be applied for a long period of time to cancel the depolarization effect even after the voltage higher than the voltage Vd is applied to the piezoceramic element in the direction opposite to its polarization direction. For example, as shown in FIG. 4A, when a voltage higher than 66 V and a voltage lower than 57 V can be applied in the same direction as and the direction opposite to the polarization direction of the piezoceramic element, respectively, degradation of the piezoceramic element can be prevented when the element is driven at a duty of ½. Similarly, when a voltage higher than 66 V and a voltage lower than 48 V are applied to the piezoceramic element in the same direction and the direction opposite to the polarization direction, element degradation can be prevented when the element is driven at a duty of 1/10. When the recovery effect obtained while polarity switching is utilized, it is necessary to recover the element within at least the same period of time as the depolarization time. The relationship between the power source voltage $V_C$ and the voltage applied in the direction opposite to the polarization direction so as to satisfy the above condition varies in accordance with the material of the piezoceramic element. However, as shown in FIG. 4A, $V_C$ voltage must be higher than the voltage applied in the direction opposite to the polarization direction by Vp/10.

Inequalities (1) and (2) can be applied to this case. However, even if inequalities (1) and (2) are satisfied, the voltage applied in the direction opposite to the polarization direction is limited. When this voltage comes closer to the voltage Vp, depolarization is abruptly increased, as shown in FIG. 4A. Therefore, even if the polarization effect is obtained, the element has unstable characteristics. In practice, inequality (3) must also be satisfied.

As is apparent from the above description, the driving method for positively utilizing the polarization effect is very effective when a voltage higher than the voltage Vd is applied while the polarities of such a voltage are switched. When a conventional analog AC power source is used, application of a sufficient voltage to recover the depolarization effect cannot be guaranteed.

In the present invention, the voltages Vp and Vd greatly depend on changes in temperatures. The voltages Vp and Vd must be defined at a given operation temperature. However, the voltages Vp and Vd have negative temperature coefficients and can decrease at high temperatures. In practice, the voltages Vp and Vd are preferably defined at the upper limit of the operating temperature.

FIG. 4B is another graph for explaining the effect of the present invention. FIG. 4B shows a case wherein the bimorph element in FIG. 4A is operated for a long period of time at a voltage $V_C$ of 80 V and a duty of ½. Even if a voltage ($V_C-V_{ZD}$) applied in the direction opposite to the polarization direction becomes higher than the polarization degradation voltage Vd and becomes a voltage of 40 to 50 V, degradation does not substantially occur. However, in a conventional circuit, since a voltage having the same level as the voltage applied in the same direction as the polarization direction is also applied in the direction opposite to the polarization direction, the conventional element is degraded even if a power source voltage 40 V slightly higher than the voltage Vd is applied thereto.

The driving method has been described wherein the polarization effect when polarity inversion is utilized. However, when the duty is very small or polarity inversion can be little expected, the following inequality is preferably satisfied:

$$V_C - V_{ZD} < \text{polarization degradation voltage Vd} \qquad (4)$$

The reason why the Darlington transistor pairs DTr1 and DTr2 are used in FIG. 1 will be described hereinafter. In order to operate one of the Darlington transistor pairs DTr1 and DTr2 so as to switch the polarity of the voltage, the base current must be flowed from the constant voltage circuit 4. However, since the voltage is high, even a small current causes high power consumption. The bimorph element serves as a capacitive load, so power is not required to maintain the displacement. However, when the polarity switching circuit 3 greatly consumes power so as to hold the switching state, the bimorph loses its advantage as a low-power element. The Darlington transistor pairs DTr1 and DTr2 are used to increase the current-amplification factor. The current flowed in the bimorph element 1 is approximately several to several tens of milliamperes. When a current-amplification factor of the Darlington transistor pair is set at about $10^4$, the required base current is not more than several microamperes. Even if the 100-V constant voltage circuit 4 is used, power required to maintain the switched state is about 0.1 to 1 mW. In the polarity switching circuit 3, each of the resistors R3 and R7 has a resistance of several to several tens of megohms. Resistors having such high resistance can be easily mounted by soldering on a ceramic board. The respective components can be of low current capacity, so that chip components can be used. Therefore, the components, including the polarity switching circuit 3 and the drive input circuit 2 but excluding the transformer TR of the constant voltage circuit 4 can be obtained as a hybrid $I_C$. Furthermore, the respective components can also be obtained in the bipolar $I_C$ process, so that a one-chip $I_C$ can be obtained.

The operation of the constant current diode CRD will be described. The constant current diode CRD can be replaced with a resistor. However, the constant current diode has an advantage over a resistor.

FIGS. 5A to 5F are diagrams for explaining the advantage of the constant current diode CRD over a resistor. As shown in FIG. 5A, when a bimorph element C is charged by a constant voltage power source $V_C$ through a resistor R and a switch SW, a large current flows in the initial period (FIG. 5B), and the voltage immediately increases (FIG. 5C). The bimorph element can be quickly operated, but its current abruptly and exponentially decreases to slow down an increase in the voltage. As a result, the operation of the bimorph element becomes slowed down when the displacement is maximum, resulting in inconvenience. The time t is plotted along the abscissa in FIG. 5B, and the charge current $I_C(V_C/R)$ is plotted along the ordinate therein.

The time t is plotted along the abscissa in FIG. 5C, and the charge voltage $V_C$ is plotted along the ordinate therein.

However, when a bimorph element C is charged by a constant voltage power source $V_C$ through the constant current diode CRD and the switch SW, as shown in FIG. 5D, a substantially constant current (FIG. 5E) flows across the bimorph element C even if the bimorph element C is sufficiently charged. At the same time, the voltage (FIG. 5F) is linearly increased at the same increase rate. Therefore, the change rate of the operation of the bimorph element is constant and rapid. It should be noted the constant current diode CRD is connected to the input terminal of the polarity switching circuit 3 in FIG. 1.

The operation of the Zener diode ZD7 connected across the input terminals of the polarity switching circuit 3 will be described. As shown in FIG. 1, when one (i.e., the terminal A) of the terminals of the polarity switching circuit 3 is positive, polarity switching is performed. In this case, the carriers charged by the bimorph element 1 are discharged through a path of the electrodes H1 and H2, the Zener diodes ZD1 and ZD2 in the drive input circuit 2, the terminal A, the transistor Tr4 in the polarity switching circuit 3, the terminal G', the Zener diode (forward bias) ZD7, the terminal C', the transistor pair Dtr2 in the polarity switching circuit 3, the terminal B and the central electrode S. At the same time or thereafter, the charge current flows from the constant voltage circuit 4 through a path of the constant current diode CRD, the transistor pair DTr2 in the polarity switching circuit 3, the terminal B, the drive input circuit 2, the electrodes S, T1 and T2 in the bimorph element 1, the Zener diodes ZD1 and ZD2 of the drive input terminal 2, the terminal A, and the transistor Tr4 in the polarity switching circuit 3. The bimorph element 1 is charged. In this manner, in order to cancel the charge, the forward bias characteristics of the Zener diode ZD7 are used to decrease the power consumption.

In the above description, the forward bias characteristics of the Zener diode ZD7 are required. Therefore, a normal diode can be used in place of the Zener diode. However, the reason why the Zener diode is used is that a surge voltage exceeding the power source voltage or $V_C$ can be absorbed even if applied thereto.

In FIG. 1, a bridge circuit, i.e., the same circuit as the polarity switching circuit 3 is connected in parallel with the terminals C and G' to drive a plurality of bimorph elements using one power source.

Figure 6:
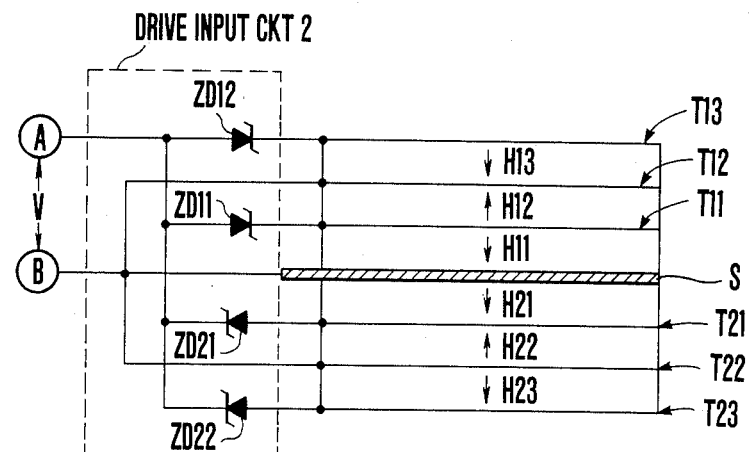
FIG. 6 is a circuit diagram of a modification of the bimorph element and a drive input circuit according to the present invention.

FIG. 6 shows a bimorph element according to another embodiment of the present invention. A plurality of electrodes are sandwiched between piezoceramic elements with respect to a central electrode S. In this embodiment, a pair of piezoceramic elements H11 and H21 polarized downward are formed on the upper and lower surfaces of the central electrode S. Another pair of piezoceramic elements H12 and H22 polarized upward are formed on the piezoceramic elements H11 and H21 through electrodes T11 and T21, respectively. Still another pair of piezoceramic elements H13 and H23 polarized in the same manner as the piezoceramic elements H11 and H21 are formed on the piezoceramic elements H12 and H22 through electrodes T12 and T22, respectively. In this manner, a six-layer bimorph element is constituted. A drive input circuit 21 is arranged as follows. The central electrode S sandwiched between the piezoceramic elements H11 and H21, the electrode T12 sandwiched between the piezoceramic elements H13 and H12, and the electrode T22 sandwiched between the piezoceramic elements H22 and H23 are commonly connected to a terminal B. An electrode T13 formed on the upper surface of the piezoceramic element H13 and the electrode T11 sandwiched between the piezoceramic elements H12 and H11 are connected to the cathodes of Zener diodes ZD12 and ZD11 and then to a terminal A. The electrode T21 sandwiched between the piezoceramic elements H21 and H22 and an electrode T23 formed on the piezoceramic element H23 are connected to the anodes of Zener diodes ZD21 and ZD22 and then to the terminal A. When the terminal A is set at a positive potential, a voltage $V_C$ is applied to the piezoceramic elements H11, H12 and H13 in the same direction, and voltages $V_C - V_{ZD21}$, $V_C - V_{ZD21}$ and $V_C - V_{ZD22}$ are respectively applied to the piezoceramic elements H21, H22 and H23 in a direction opposite to that of the elements H11, H12 and H13. The bimorph element of this embodiment can be used under the conditions given by inequalities (1) to (3).

Figure 7:
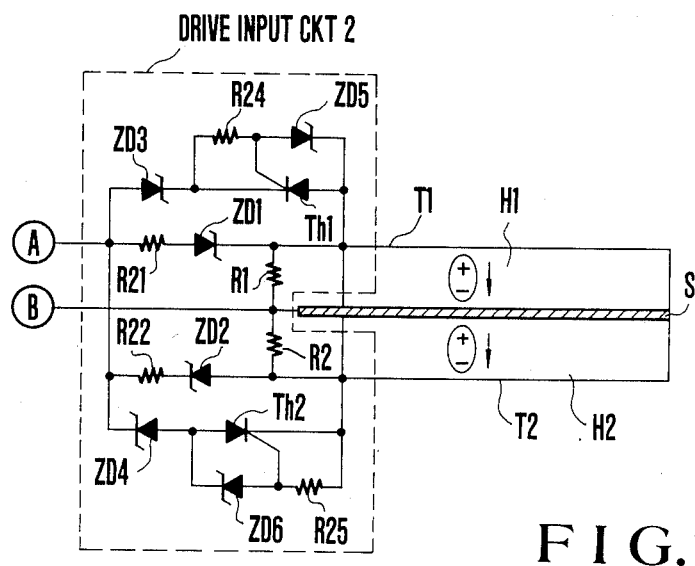
FIG. 7 is a circuit diagram of another modification of the bimorph element and a drive input circuit according to the present invention.

FIG. 7 shows another arrangement of a drive input circuit for driving the bimorph element shown in FIG. 1. Referring to FIG. 7, thyristors Th1 and Th2 are connected in parallel with the Zener diodes ZD1 and ZD2, respectively. A series circuit of a resistor R21 and the Zener diode ZD1 is connected in parallel with a series circuit of a Zener diode ZD3 and the thyristor Th1. In this case, in the same manner as the Zener diode ZD1, the anode of the Zener diode ZD3 is connected to the terminal A. The cathode of the Zener diode ZD3 is connected to the cathode of the thyristor Th1. The anode of the thyristor Th1 is connected together with the cathode of the Zener diode ZD1 to the electrode T1 contacting the positive polarization surface of the piezoceramic element H1. A common junction between one end of a resistor R24 and the anode of the Zener diode ZD5 is connected to the gate of the thyristor Th1. The other end of the resistor R24 is connected to the cathode of the thyristor Th1, and the other electrode (cathode) of the Zener diode ZD5 is connected to the anode of the thyristor Th1.

A series circuit of a resistor R22 and the Zener diode ZD2 is connected in parallel with a series circuit of a Zener diode ZD4 and a thyristor Th2. In this case, in the same manner as the Zener diode ZD2, the cathode of the Zener diode ZD4 is connected to the terminal A, and the anode thereof is connected to the anode of the thyristor Th2. The cathode of the thyristor Th2 is connected together with the anode of the Zener diode ZD2 to the electrode T2 contacting the negative polarization surface of the piezoceramic element H2. A common junction between one end of a resistor R25 and the anode of a Zener diode ZD6 is connected to the gate of the thyristor Th2. The other end of the resistor R25 is connected to the cathode of the thyristor Th2, and the other electrode (cathode) of the Zener diode ZD6 is connected to the anode of the thyristor Th2.

Figure 8:
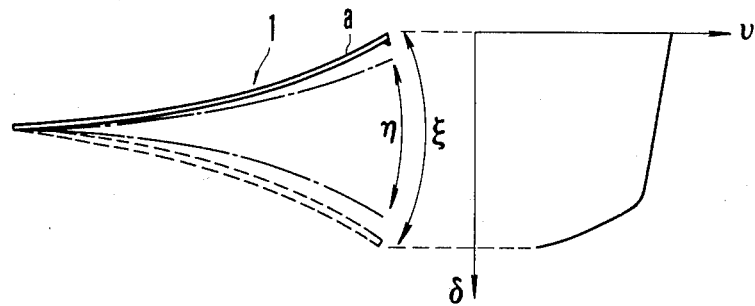
FIG. 8 is a graph showing the relationship between changes in velocity of the bimorph element and its displacement when polarity switching is performed.

The purpose of this drive input circuit will be described hereinafter. A maximum displacement is required when a piezoelectric actuator is subjected to polarization switching. The piezoelectric actuator must be driven at high velocity as needed. In this case, the characteristics of the element shown in FIG. 1 are often not sufficient. Since the bimorph element has hysteresis characteristics, it can be quickly displaced to a given position even if the polarization is switched. Thereafter, however, the displacement speed is decreased so that the bimorph element reaches a final position after a relatively long period of time has elapsed. FIG. 8 shows changes in velocity of a distal end a of the bimorph element 1 when the polarization is switched to cause the element 1 to move from the state indicated by the solid line to the state indicated by the dotted line. When the bimorph element 1 is subjected to high-speed oscillation, the polarization is inverted before the bimorph element 1 is completely displaced to a given direction, thereby decreasing the overall displacement magnitude, as indicated by the alternate long and short dashed line. Referring to FIG. 8, v is the velocity of the distal end a of the bimorph element 1, $\delta$ is the displacement, $\xi$ is the displacement magnitude when the bimorph element 1 is vibrated in the normal mode, and $\eta$ is the displacement magnitude when the bimorph element is vibrated in the high-speed mode.

When a material having a low polarization degradation voltage is used, a voltage having a polarity opposite to the polarization direction cannot be applied to the bimorph element for a long period of time, but it is often desired that a displacement and the resultant force be large at the time of polarization switching.

In this case, in the circuit of FIG. 1, the Zener diodes ZD1 or ZD2 are replaced with the corresponding thyristors or are used together therewith to improve the characteristics. In the arrangement in FIG. 7, it is impossible to apply an excessive voltage to the piezoceramic element in a direction opposite to the polarization direction for a long period of time, but a voltage higher than the polarization degradation voltage Vd can be applied for a short period of time. Under this assumption, a high voltage is applied to the bimorph element only when it is subjected to polarization switching.

Figure 9:
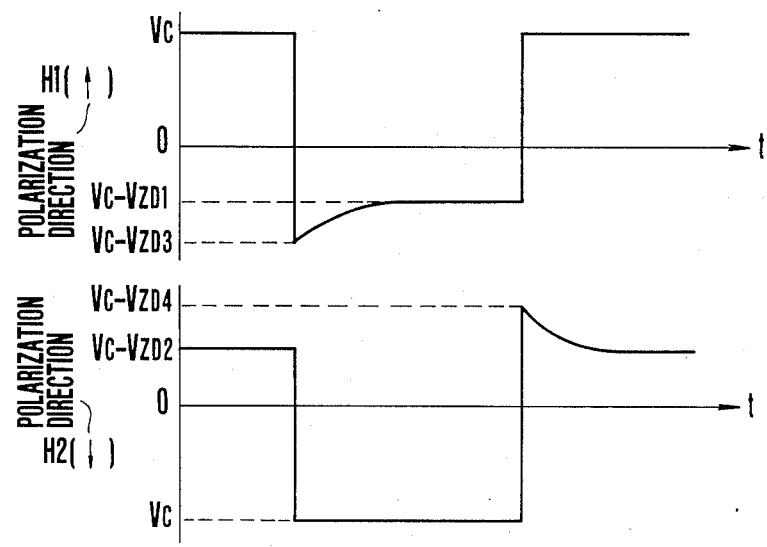
FIG. 9 is a timing chart showing drive voltages applied to the respective piezoceramic elements so as to explain the operation of the arrangement in FIG. 7.

The operation of the circuit shown in FIG. 7 will be described. The Zener diodes ZD1 to ZD6 satisfy the following inequalities: $V_{ZD3} < V_{ZD1}$, $V_{ZD1} - V_{ZD3} < V_{ZD5} < 2V_C - V_{ZD3}$, $V_{ZD4} < V_{ZD2}$, and $V_{ZD2} - V_{ZD4} < V_{ZD6} < 2V_C - V_{ZD4}$. When the terminal A is set at a positive potential, the voltage $V_C$ is applied to the piezoceramic element H1 in the same direction as the polarization direction since the Zener diode ZD1 is forward-biased. However, since the Zener diode ZD2 is reverse-biased, the voltage $V_C - V_{ZD2}$ having a polarity opposite to the polarization direction is applied to the piezoceramic element H2. This operation is illustrated in FIG. 9.

When the polarization is inverted, the terminal B is set at a positive potential, and the terminal A is set at the ground potential. The electrode T1 formed on the upper surface of the piezoceramic element H1 is set at a voltage of $2V_C$ since the voltage at the terminal B is added upon polarity switching to the voltage $V_C$ charged by the piezoceramic element H1 before polarity switching. As a result, the voltage of $2V_C$ is applied to the series circuit of the Zener diodes ZD3 and ZD5. Since condition $V_{ZD3} + V_{ZD5} < 2V_C$ is established, the current flows in the gate of the thyristor Th1 which is then turned on. A charge current to the piezoceramic element H1 flows in a path of the terminal B, the piezoceramic element H1, the thyristor Th1, the Zener diode ZD3 and the terminal A in the order named. The applied voltage becomes $V_C - V_{ZD3}$ and has a direction opposite to the polarization direction. In this manner, after charging is completed, the current will not flow any longer, so that the thyristor Th1 is turned off. Thereafter, the charge of the piezoceramic element H1 is discharged through the resistor R1 until the voltage reaches $V_C - V_{ZD1}$. The resistor R1 has a resistance of several megohms. However, since the Zener diode ZD2 is forward-biased, the voltage $V_C$ is applied to the piezoceramic element H2 in the same direction as the polarization direction.

When the polarity is inverted again, the voltage $V_C - V_{ZD4}$ is applied to the piezoceramic element H2 in the direction opposite to the polarization direction. Upon OFF operation of the thyristor Th2, the piezoceramic element H2 is set at the voltage of $V_C - V_{ZD2}$. The voltage $V_C$ is applied to the piezoceramic element H1 in the same direction as the polarization direction.

Since the high voltage is applied in the direction opposite to the polarization direction when the polarization switching is performed, the bimorph element is displaced with a large force. However when the voltage applied in the direction opposite to the polarization direction decreases below the polarization degradation voltage due to self discharge, degradation characteristics will not occur. When this circuit is used, the influence of the above-mentioned hysteresis characteristics can be omitted. Therefore, even if the bimorph element is driven at high speed, the displacement magnitude will not be decreased.

Figure 10:
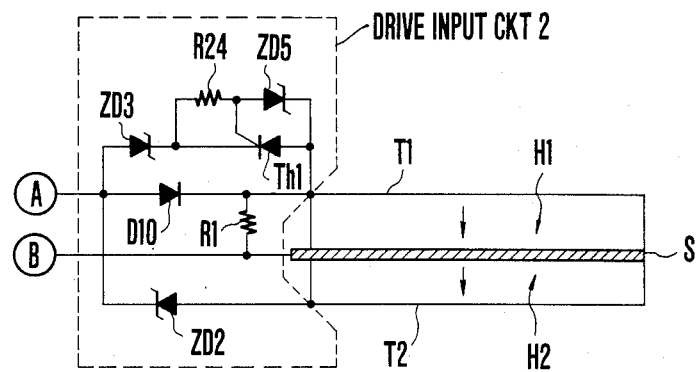
FIG. 10 is a circuit diagram of still another modification of the bimorph element and the drive input circuit according to the present invention.
Figure 11:
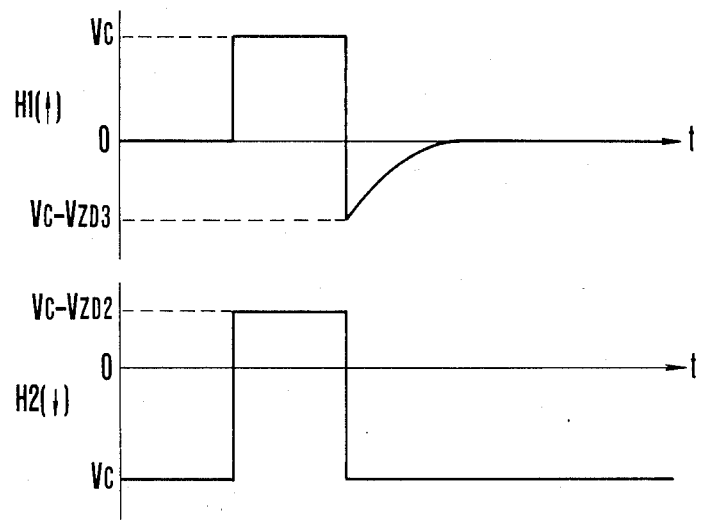
FIG. 11 is a timing chart showing drive voltages applied to the respective piezoceramic elements so as to explain the operation of the arrangement in FIG. 10.

A drive input circuit according to still another embodiment will be described with reference to FIG. 10 wherein the polarization degradation voltage is low and a high voltage having a polarity opposite to the polarization direction of the piezoceramic element cannot be applied to the piezoceramic element for a long period of time. Referring to FIG. 10, a series circuit of a Zener diode ZD3 and a thyristor Th1 and a series circuit consisting of a resistor R24 and a Zener diode ZD5 to turn on/off the thyristor Th1 are used in the same manner as in the arrangement of FIG. 7. In the embodiment in FIG. 10, a diode D10 is used in place of the series circuit of the resistor R21 and the Zener diode ZD1. Only the Zener diode ZD2 is connected between the electrode T2 and the terminal A connected to the piezoceramic element H2. In this case, the cathode of the diode D10 is connected to the electrode T1 of the piezoceramic element H1. The anode of the Zener diode ZD2 is connected to the electrode T2.

The operation of the drive input circuit in FIG. 10 will be described hereinafter. Assume that the terminal B connected to the central electrode S is set at a positive potential, and that the polarity of the voltage is intermittently inverted in a pulsed manner. In this case, since the terminal B is set at the positive potential, no voltage is applied to the piezoceramic element H1 since the diode D10 is reverse-biased. The voltage $V_C$ is applied to the piezoceramic element H2 in the same direction as the polarization direction. In this state, polarization degradation will not occur. When the polarity of the voltage changes, the voltage $V_C$ is applied to the piezoceramic element H1 in the same direction as the polarization direction, and the voltage $V_C - V_{ZD2}$ is applied to the piezoceramic element H2 in the direction opposite to its polarization direction. When a short period of time has elapsed and the polarity of the voltage is inverted, the thyristor Th1 is turned on in the same manner as in FIG. 7, so that the voltage $V_C - V_{ZD3}$ is instantaneously applied to the piezoceramic element H1 in the direction opposite to its polarization direction. Thereafter, when the thyristor Th1 is turned off, the carriers are discharged through a resistor R1 connected between the electrode T1 and the central electrode S, so that the voltage applied to the piezoceramic element H1 becomes zero.

Since the voltage $V_C$ is applied to the piezoceramic element H2 again, slight depolarization upon application of the voltage $V_C - V_{ZD2}$ in the direction opposite to the polarization direction is cancelled by the polarization increase effect, as previously described in detail. In this manner, even in the bimorph element wherein the polarization degradation voltage is low, and a high voltage having a polarity opposite to the polarization direction cannot be applied over a long period of time, a large displacement with a large force can be obtained. This drive input circuit is suitable for a coin processing mechanism to be described later.

Figure 12:
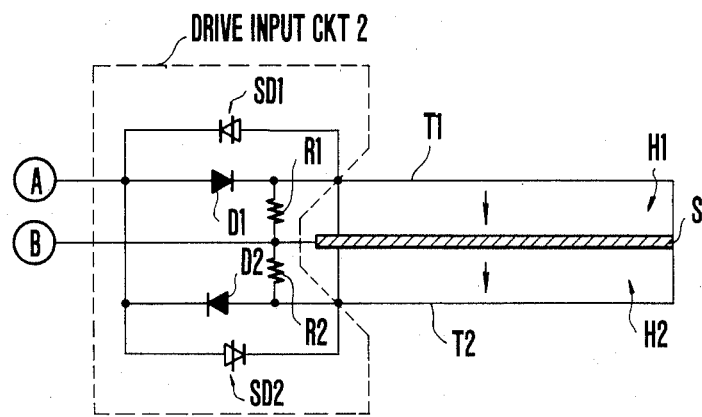
FIG. 12 is a circuit diagram of still another modification of the bimorph element and the drive input circuit according to the present invention.
Figure 13:
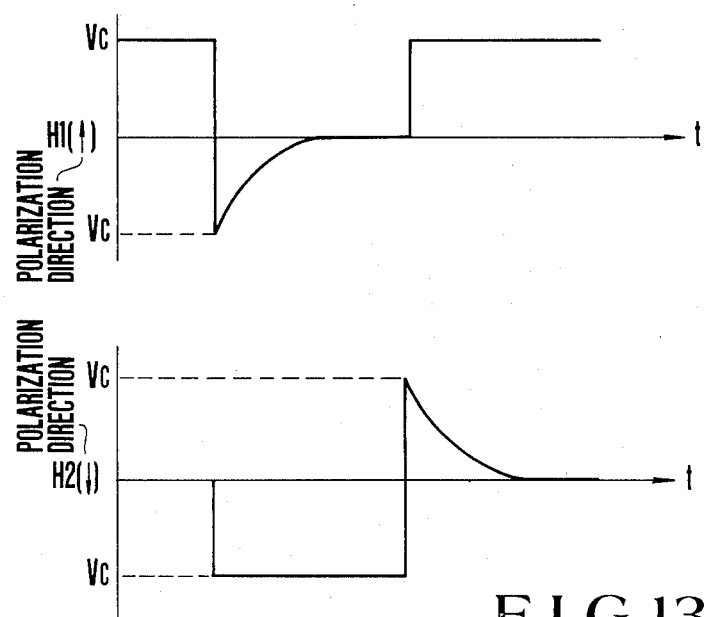
FIG. 13 is a timing chart showing drive voltages applied to the respective piezoceramic elements so as to explain the operation of the arrangement in FIG. 12.

FIG. 12 shows still another modification of the drive input circuit for the bimorph element. Two PNPN Shockley diodes are used in place of the thyristors. In this case, a diode D1 is inserted between the terminal A and the electrode T1 of the piezoceramic element H1. The cathode of the diode D1 is connected to the electrode T1. A Shockley diode SD1 is connected in parallel with the diode D1 and is reverse biased with respect to the diode D1. A discharge resistor R1 having a high resistance is connected between the electrode T1 and the central electrode S (the terminal B). The connection between the piezoceramic element H2 and the corresponding drive input circuit portion is opposite to that between the piezoceramic plate H1 and the corresponding drive input circuit portion. One end of a diode D2 is connected to the terminal A, and the anode of the diode D2 is connected to the electrode T2 of the piezoceramic element H2. A Shockley diode SD2 is connected in parallel with the diode D2 and is reverse-biased with respect to the diode D2. A discharge resistor R2 is connected between the electrode T2 and the central electrode S (the terminal B). The voltages applied to the piezoceramic elements H1 and H2 and the polarization directions are illustrated in FIG. 13. In this case, application of voltages to the respective piezoceramic elements in the direction opposite to their polarization direction are performed only when the polarities of the voltages are inverted. The Shockley diodes SD1 and SD2 are turned on at a voltage lower than the voltage of $2V_C$.

Figure 14:
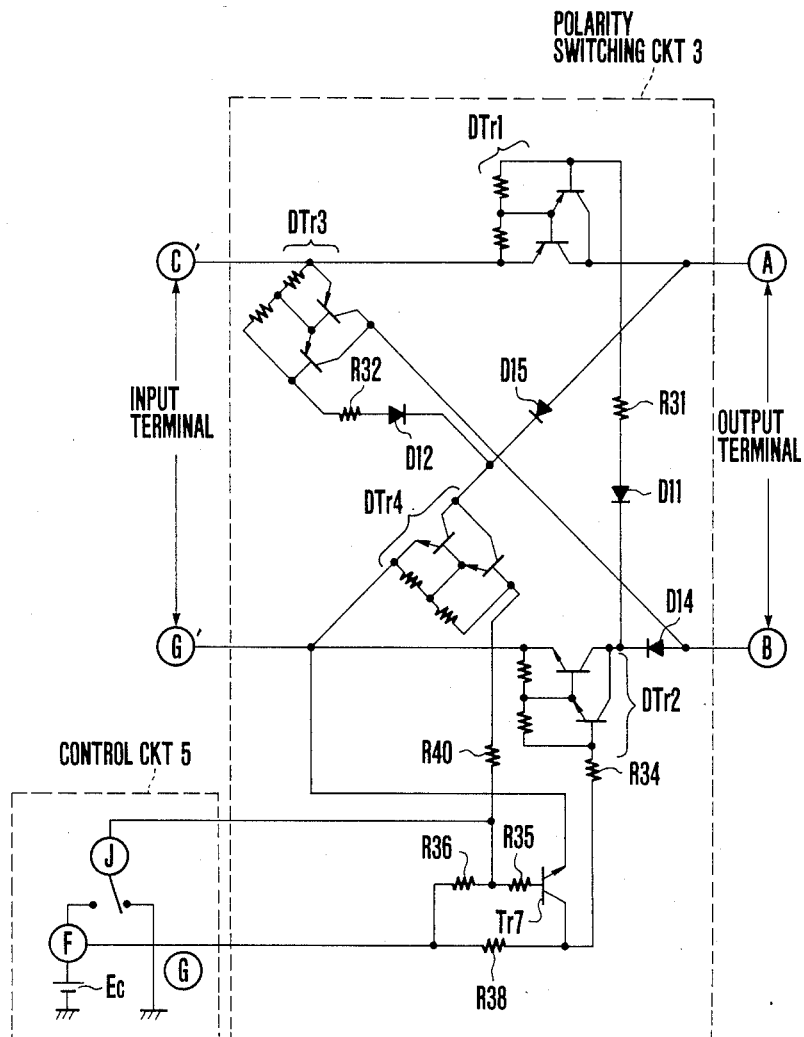
FIGS. 14, 15 and 16 are respectively circuit diagrams of modifications of the polarity switching circuit.

FIG. 14 shows a polarity switching circuit wherein a control circuit of the polarity switching circuit 3 is simplified to hold the switching state with lower power. This polarity switching circuit is characterized in that the transistors Tr2 and Tr4 of the polarity switching circuit 3 in FIG. 1 are replaced with Darlington transistor pairs DTr2 and DTr4, and the bases of the Darlington transistor pairs DTr1 and DTr3 are connected to the collectors of the Darlington transistor pairs DTr2 and DTr4 through diodes, respectively.

More particularly, the base of the Darlington transistor pair DTr1 is connected to the collector of the Darlington transistor pair DTr2 through a resistor R31 having a high resistance and a forward-bias diode D11. The base of the transistor pair DTr3 is connected to the collector of the transistor pair DTr4 through a resistor R32 having a high resistance and a forward-bias diode D12. A diode D14 is connected between the transistor pair DTr2 and the terminal B (the collector of the transistor pair DTr3) such that the anode of the diode D14 is connected to the terminal B. A diode D15 is connected between the transistor pair DTr4 connected to the diode D12 and the terminal A such that the anode of the diode D15 is connected to the terminal A.

The polarity switching circuit 3 also has an NPN transistor Tr7. The collector of the transistor Tr7 is connected to the base of the transistor pair DTr2 through a resistor R34, and the emitter of the transistor Tr7 is connected to the input terminal G' of the polarity switching circuit 3. The base of the transistor Tr7 is connected to a terminal F for a DC power source $E_C$ through resistors R35 and R36. Similarly, the collector of the transistor Tr7 is connected to the terminal F through a resistor R38. A slider J of the control circuit 5 is connected to a common junction between the resistors R36 and R35 and to the base of the transistor pair DTr4 through a resistor R40.

The operation of the polarity switching circuit 3 will be described. When the terminal J is connected to the terminal G of the control circuit 5 and is set at low level, a current will not flow in the base of the transistor Tr7 which is then kept off. The collector of the transistor Tr7 goes to high level, and the transistor pair DTr2 is turned on. A base current flows in the base of the transistor pair DTr1, so that the transistor pair DTr1 is turned on.

When the terminal J is connected to the terminal F of the control circuit 5 and is set at high level, the transistor pair DTr4 is turned on and a current flows to the base of the transistor pair DTr3 to turn it on. However, when the terminal J goes high, the transistor Tr7 is turned on, and the collector of the transistor Tr7 is set at low level. The base circuit for the transistor pair DTr2 is set at the ground level and is thus turned off. In this manner, polarity switching can be performed in accordance with the operation whether the terminal J is set at the ground level (low) or the $E_C$ level (high).

Figure 15:
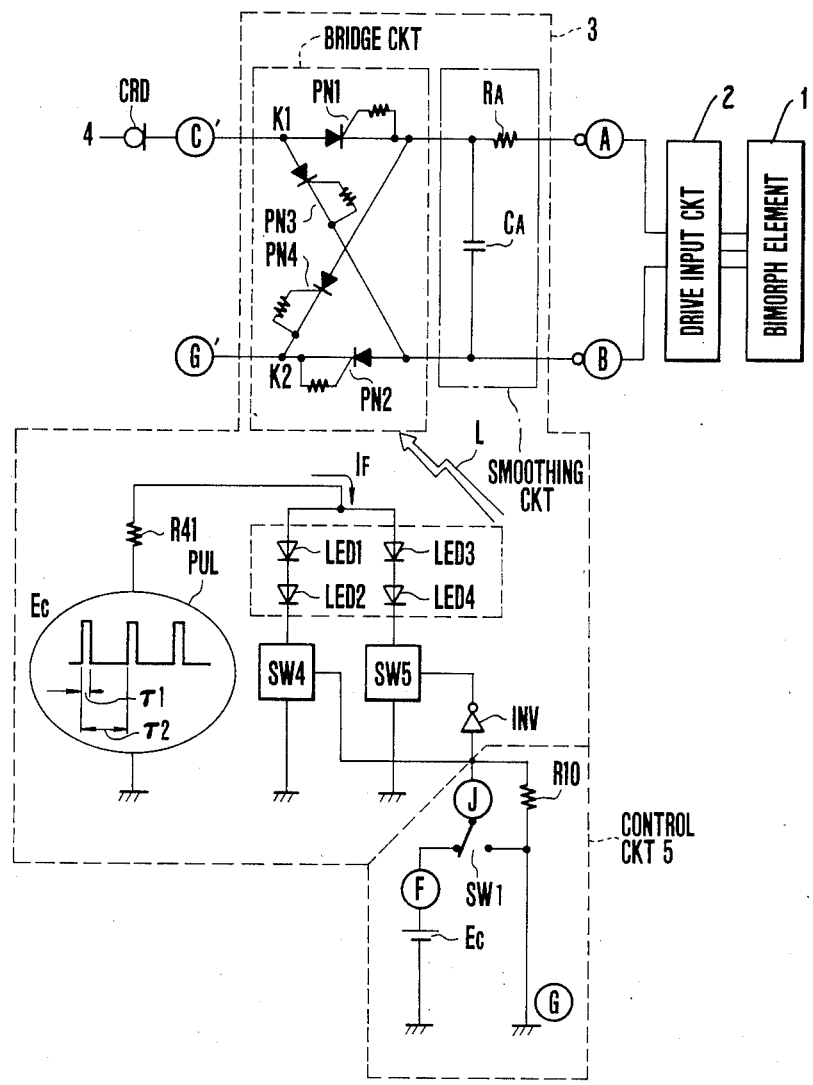

FIG. 15 shows another arrangement of the polarity switching circuit using a PNPN switch (thyristor) photocoupler. Referring to FIG. 15, reference symbols PN1 to PN4 denote PNPN switches which constitute a bridge circuit. A common junction K1 between the anodes of the PNPN switches PN1 and PN3 is connected to a terminal C' of the constant voltage circuit 4. A common junction K2 between the cathodes of the PNPN switches PN2 and PN4 is connected to a terminal G'. The cathode of the PNPN switch PN1 is connected to the anode of the PNPN switch PN4. The cathode of the PNPN switch PN3 and the anode of the PNPN switch PN2 are connected to the drive terminals A and B of the drive input circuit 2, respectively.

Reference symbols LED1 to LED4 denote light-emitting diodes for emitting light L onto the PNPN switches PN1 to PN4 to turn on the switches PN1 to PN4, respectively; SW4 and SW5, switches which have an FET, MOS, CMOS element structure and which do not require the control circuit power; INV, an inverter for inverting a logic input level; and PUL, a pulse generator for enabling/disabling the logic control voltage $E_C$ and for generating intermittent pulses. The above components constitute the polarity switching circuit 3. This polarity switching circuit 3 is the same as that in FIG. 1.

The operation of the above polarity switching circuit 3 will be described. When a power switch (not shown) is turned on, the pulse generator PUL is started. When the switch SW1 in the control circuit 5 is set in the position illustrated in FIG. 15, the voltage from the power source $E_C$ is applied to the switch SW4 which is then turned on. However, since the switch SW5 is connected from the terminal J through the inverter INV, the switch SW5 is kept OFF. As a result, the output from the pulse generator PUL supplies a current IF along a path of the light-emitting diodes LED1 and LED2 and the switch SW4 in the order named through the resistor R41. Only the light-emitting diodes LED1 and LED2 flash in response to the voltage pulses from the pulse generator PUL. The PNPN switches PN1 and PN2 receive the first pulse light L and are turned on, so that a constant current flows through the constant current diode CRD. When the current flow is started, the PNPN switches PN1 and PN2 are kept ON until the bimorph element 1 is charged even after the pulse light L disappears. When the bimorph element is charged and the current will not flow, the PNPN switches PN1 and PN2 are turned off. It is possible to drive the bimorph element 1 by a single pulse. However, for the following reason, the bimorph element 1 is preferably driven in response to a continuous pulse signal. When the bimorph element 1 is charged with one pulse, the element 1 may often not be sufficiently charged, and a displacement corresponding to the power source voltage cannot be obtained. In order to resolve this problem, the continuous pulse signal is supplied from the pulse generator PUL.

A pulse interval τ2 of the output from the pulse generator PUL is preferably long enough to decrease control power. However, when the pulse interval becomes excessively long, a slight displacement rebound occurs. A slight vibration occurs at the displacement side in synchronism with the pulse width. In order to prevent this, the pulse interval is preferably not more than 100 ms.

However, when the pulse interval τ2 becomes short, the above-mentioned slight vibration will not occur, and high-speed operation can be performed. However, when the pulse interval becomes shorter than the charge time constant and the switch SW1 is operated at high speed, the PNPN switches PN3 and PN4 which are connected in a diagonal relationship are often driven while the PNPN switches PN1 and PN2 which are connected in parallel with each other are held ON, thereby short-circuiting the bridge circuit In order to prevent this, the pulse interval is preferably not less than 0.5 ms. In effect, the pulse interval τ2 falls within the range between 0.5 ms and 100 ms.

A pulse width τ1 is determined in accordance with the switch sensitivity and is set at several tens of microseconds. Therefore, the duty becomes 1/50 to 1/10,000, and the control power for holding the bimorph element 1 in the displacement position becomes very small. It should be noted an LED current IF 20 mA (5 V) achieves a power of not more than 0.1 mW at a duty of not more than 1/1,000.

The polarity switching circuit 3 in FIG. 15 has a smoothing circuit (surrounded by the alternate long and short dashed line) between the bridge circuit and the terminals A and B. The smoothing circuit will be described in detail hereinafter. As described above, when the pulse width is excessively increased, the bimorph element irregularly vibrates at a displaced position, so that the pulse width must fall within the predetermined range. In order to prevent such an irregular vibration, a smoothing circuit is inserted between the bimorph element 1 and the bridge circuit. The smoothing circuit comprises a combination of a capacitor $C_A$ and a resistor $R_A$, or a combination of a capacitor (not shown) and a bidirectional constant current diode (not shown). When the bimorph element 1 is charged, the capacitor $C_A$ is also charged. A charge voltage lowered by leakage can be compensated by the charge from the capacitor $C_A$.

Figure 16:
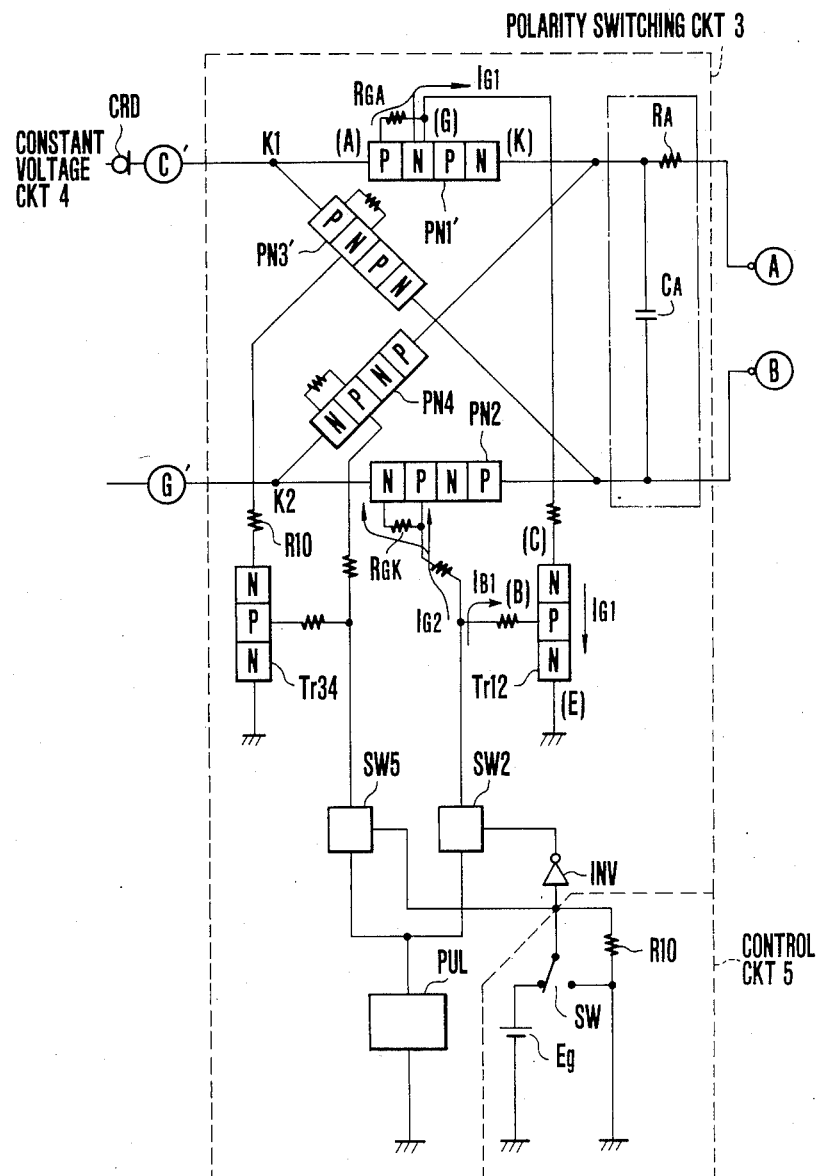

Still another embodiment of the present invention will be described. The gate of the PNPN switch is separated from the control circuit by using the photocoupler in FIG. 15. However, the PNPN switch can be isolated from the control circuit by using a P-N reverse junction. As shown in FIG. 16, current-driven PNPN switches are used, and the gate circuit is isolated from the logic control circuit by using the P-N reverse junction of the transistor. Referring to FIG. 16, reference symbols PN1' and PN3' denote N-channel gate PNPN switches (thyristors); PN2 and PN4, P-channel gate PNPN switches (thyristors); and $R_{GA}$ and $R_{GK}$, a gate anode resistor and a gate cathode resistor, respectively. Reference symbols Tr12 and Tr34 denote NPN transistors, respectively. The basic arrangement of this circuit is substantially the same as that in FIG. 15, and a detailed description thereof is omitted.

Assume that a bimorph element is used as an actuator wherein one end is fixed and the other end is used as an operating portion subjected to displacement. When a large acceleration acts on the bimorph actuator, the bimorph element is often cut in the vicinity of a fixed portion 30, as shown in FIG. 17. Reference symbol ξ1 denotes the displacement caused by a voltage applied to the bimorph element 1; and ξ2, the maximum displacement representing the limit subject to mechanical destruction. The above-mentioned acceleration is generated when main equipment incorporating a coin processing unit is accidentally dropped and receives a strong impact.

In order to prevent the bimorph element 1 from being displaced exceeding the displacement ξ2, a back stopper 32 is disposed to limit the displacement of the bimorph element. The back stopper 32 has regulating surfaces 32a and 32b to prevent a displacement exceeding the displacement ξ2. When the back stopper 32 is disposed to limit a displacement corresponding to the displacement ξ1, the residual vibration of the bimorph element 1 can be prevented.

FIG. 19 shows a still another embodiment wherein the bimorph element 1 is mounted in a case to obtain a bimorph actuator in accordance with the principle in FIG. 18. Projections 40a and 40b are formed on parts of a substantially U-shaped case 40 and opposed to the operating portion (i.e., the free end) of the bimorph element 1. The projections 40a and 40b serve as a displacement regulation mechanism. The bimorph element 1 is fixed on a base 42 mounted on the inner bottom surface of the case 40.

Although the bimorph element 1 generates a large force when the polarity of the voltage is inverted, the element 1 cannot serve as an actuator at a near-end displacement position since the force becomes zero. For this reason, the displacement of the bimorph element 1 must not reach the near-end position. In order to resolve this difficulty, a magnetic mechanism may be used. Referring to FIG. 19, a central electrode S of the bimorph element 1 comprises a magnetic spring. Magnets 43a and 43b are disposed in the vicinities of the displacement regulation mechanisms 40a and 40b so as to oppose the magnetic spring. The attraction characteristics of the magnets 43a and 43b are indicated by the dotted lines, and the forces generated when the bimorph element 1 is displaced from the displaced position at the projection 40a in the direction indicated by the arrow upon inversion of the polarity of the voltage, are indicated by the alternate long and short dashed line in FIG. 20. The acting force of this mechanism is indicated by the solid line. The force is generated in the vicinity of the displacement end position, so that the bimorph element 1 can serve as an actuator. Since the central electrode S comprises a magnetic member, the magnetic attraction mechanism can be obtained in such a manner that the magnets 43a and 43b are disposed to oppose each other with respect to the central electrode S.

FIG. 21 shows a construction wherein two plastic insulating layers 45a and 45b are formed on a bimorph element 1 so as to improve reliability and durability against the outer atmosphere when the bimorph element is used as an actuator. In this case, the insulating layer 45a constitutes an inner layer made of a soft resin material, and the insulating layer 45b constitutes an outer layer made of a hard resin material. With this construction, the reliability of the bimorph element as an actuator can be improved. In addition, this bimorph element has a good electrical resistance, and a good resistance to humidity. The distal end of the operating portion (the free end) has a good wear resistance and a low friction resistance. Therefore, the force can be effectively transmitted to a driven mechanism. The resin material preferably comprises an ultraviolet curing resin.

Figure 22:
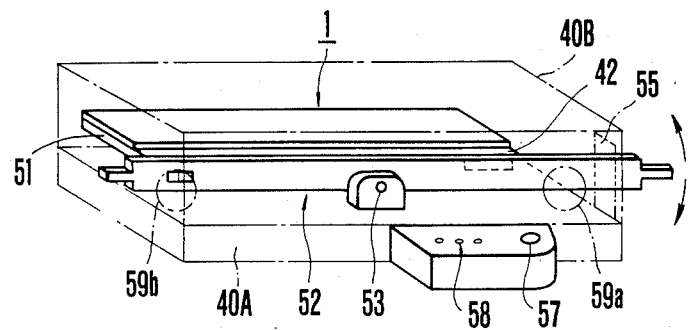
FIGS. 22, 23 and 24 are respectively perspective views showing another construction of the piezoelectric actuator using the bimorph element of the present invention.

FIG. 22 shows an application example of a unit structure wherein a swinging displacement of the bimorph element 1 is extracted through a seesaw mechanism. Reference numeral 51 denotes a transmission lever connected to the operating end (free end) of the bimorph element 1; and 52, a seesaw mechanism pivotally supported by a shaft 53. Excess external force is absorbed by the seesaw mechanism 52, thus further improving reliability of the bimorph actuator.

The support 42 for supporting the bimorph element 1 is fixed on a base 40A. An upper case 40B covers the bimorph element 1 so as not to obstruct operation of the bimorph element 1. A U-shaped recess is formed at one end of the seesaw mechanism 52 and is loosely fitted with the transmission lever 51. The other end of the seesaw mechanism 52 externally extends through a notch 55 of the upper case 40B. The distal end of the extended portion swings in the directions indicated by arrows upon vibration of the bimorph element 1. A guide hole 57 and threaded bimorph electrode terminals 58 are formed in the base 40A so as to easily mount the base 40A to another fixed member. Displacement restraint mechanisms are mounted on end portions 59a and 59b of the seesaw mechanism 52 to restrain rotation of the seesaw mechanism 52 exceeding a predetermined angle.

Figure 23:
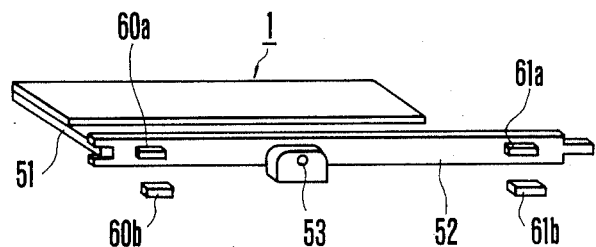

FIG. 23 shows the main part of the mechanism used in FIG. 22. The magnet 60a is mounted on the seesaw mechanism 52 in the vicinity of the portion 52 which is engaged with the lever 51, as indicated by the dotted line. The magnetic member 60b is mounted at a position on the base 40A which corresponds to the magnet 60a. A magnet 61a is mounted at an appropriate position of the seesaw mechanism so as to oppose the magnet 60a. A magnetic member 61b is mounted at a position of the base 40A which corresponds to the magnet 61a. In this case, the combination of the magnet and the magnetic member can be reversed. The two magnets can be magnetized with opposing polarities or can be arranged such that opposing poles face each other.

Figure 24:
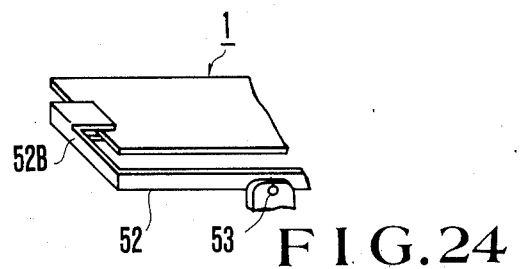

FIG. 24 shows a construction wherein the lever and the seesaw mechanism shown in FIGS. 22 and 23 are formed integrally. The free end of the bimorph element 1 is held by one end of the seesaw mechanism 52 to constitute a holding portion 52B. As a modification, the operating portion of the seesaw mechanism 52 of FIG. 22 may be located in the left side, and the arm which is located to the right of the shaft 53 may be omitted, as indicated by the dotted line. In this case, the motion of the operating portion corresponds to that of the bimorph element. In the example shown in FIG. 22, when a ratio of a distance between the shaft 53 and the bimorph movable end connecting portion to a distance between the shaft 53 and the operating portion is properly selected, a displacement of the bimorph at the operating portion can be increased/decreased.

An application example will be described with reference to FIGS. 25, 26A and 26B wherein a piezoelectric actuator using the bimorph element of the present invention as a main feature is applied to a coin processing apparatus.

Figure 25:
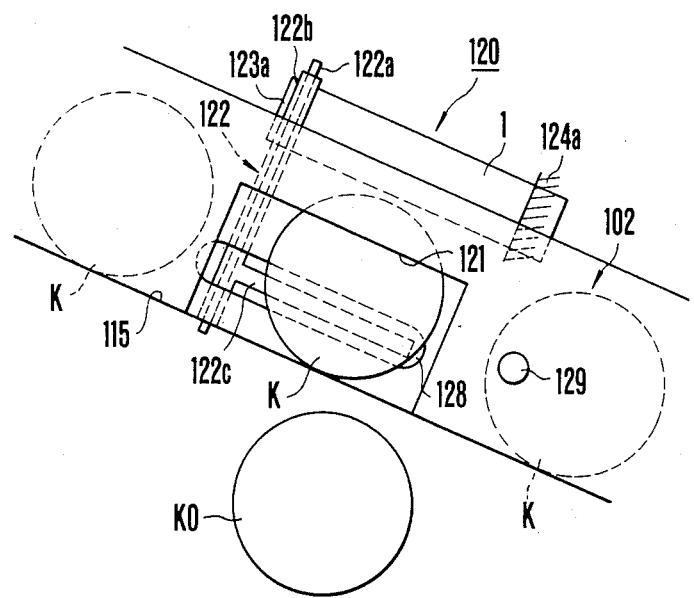
FIG. 25 is a representation for explaining the principle wherein the piezoelectric actuator using the bimorph element of the present invention is used in a coin processing apparatus.
Figure 26A:
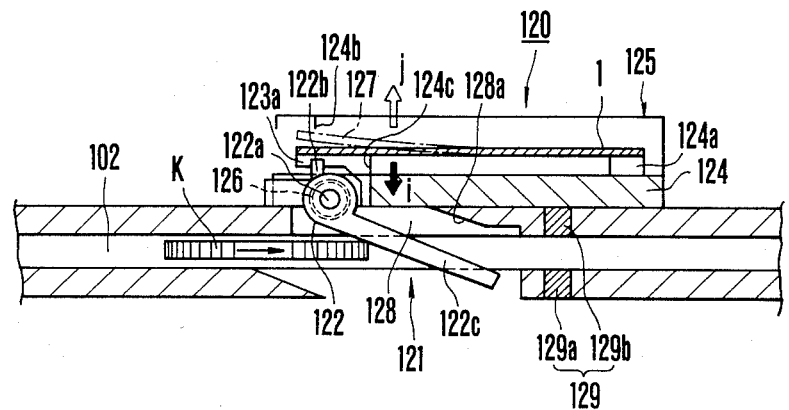
FIGS. 26A and 26B are respectively sectional views of the main part of the construction in FIG. 25.
Figure 26B:
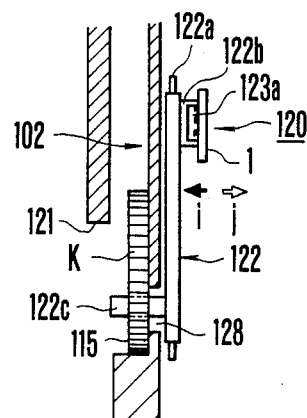

Referring to FIGS. 25, 26A and 26B, a coin (rolling object) drop mechanism 120 comprises: a coin drop port formed midway on a guide plate constituting a coin guide 102; a lever member 122 as a drop port opening/closing mechanism supported pivotally about a shaft 122a perpendicular to the coin guide 102 so as to open/close a portion of the coin guide 102 which is located near the coin drop port 121; and the bimorph element 1 which has a lock portion 123a as a lock mechanism for locking the lever member 122 and which constitutes a coin drop drive mechanism. Reference numeral 124 denotes a base having a support 124a for supporting one end portion of the bimorph element 1; and 125, a cover mounted on the base 124 to constitute a case and which holds the bimorph element 1 therein. The unit type bimorph element 1 has been described with reference to FIGS. 19 to 24. Reference numerals 124b and 124c denote stoppers for regulating the swinging movement of the operating end of the bimorph element 1 within a predetermined range in the case. A engaging portion 122b is engaged with the lock portion 123a mounted on the proximal end of the lever member 122. A blocking piece 122c extends along one end of the lever member 122 to open/close the coin guide 102. The lever member 122 is arranged such that its blocking piece 122c is constantly biased by a torsion coil spring to block the coin guide 102. Reference numeral 127 denotes a stopper for stopping at a predetermined position the lever member 122 biased clockwise by a torsion spring. An opening 128 is formed in the other guide plate having a stopper surface 128a for receiving the blocking piece 122c when the blocking piece 122c is withdrawn from the coin guide 102. A photodetecting means 129 (129a and 129b) such as a photocoupler is arranged in the downstream side of the coin drop port 121 of the coin guide 102 to detect that the coin passes thereby.

With the construction described above, a biasing force is constantly applied by the drive input circuit 2 in FIG. 1 to displace the bimorph element 1 in the direction indicated by arrow i as shown in FIG. 26A. The lock portion 123a locks the engaging portion 122b of the proximal end of the lever member 122 so as to prevent the lever member 122 from being pivoted (counterclockwise) to withdraw from the coin guide 102. In this case, the blocking piece 122c of the lever member 122 extends into the coin guide 102 to close the portion of the coin guide 102 which is located near the coin drop port 122. Therefore, a coin K rolling along the guide 102 abuts against the blocking piece 122c to change the rolling direction. The coin K is dropped through the drop port 121, as indicated by reference symbol K0.

When the polarity of the voltage applied to the bimorph element 1 is inverted, the bimorph element 1 is displaced in a direction indicated by arrow j as shown in FIG. 26A, and the lock portion 123a is released, so that the lever member 122 is biased by a spring constituting a restoration mechanism or by a self weight. The blocking piece 122c extends into the guide 102.

When the inserted coin is detected by a coin detector to be an authentic coin, the voltage is applied to the bimorph element 1 which is then displaced in the direction indicated by arrow j. As a result, the blocking piece of the lever member 122 extends unlocked into the coin guide 102. The coin K moves the blocking piece 122c against the biasing force due to its self weight and passes through the coin drop port 122. When the coin K passes through the coin drop port 122 in the manner described above, the lever member 122 returns to its initial state by means of the above-mentioned restoration mechanism. When passage of the coin K is detected by the photodetecting means 129 as the coin sensor constituted by a photocoupler or the like arranged in the downstream side of the coin guide 102, a voltage having the opposing polarity is applied to the bimorph element 1 again. Therefore, the lever member 122 is biased in the direction indicated by arrow i and is locked by the lock portion 123a.

When the lever member 122 is pivoted by the weight of the coin K, return operation is delayed when the lever member 122 is excessively rotated. The stopper surface 128a serves to prevent excessive rotation of the lever member 122. When the lever member 122 returns to its initial position, the engaging portion 122b abuts against the stopper 127, resulting in chattering. The lock portion 123a cannot be released (i.e., moved in the i direction) until chattering is stopped. A magnet mechanism may be inserted between the engaging portion 122b and the lock portion 127 to prevent chattering.

When the inserted coin is detected to be a counterfeit coin K0, or when the coin guide for storing wins is full, the polarity of the voltage applied to the bimorph element 1 is held for the lock side of the element 1. As a result, the rolling direction of the counterfeit coin K0 is changed by the lever blocking piece 122c, and the coin is dropped through the coin drop port 121.

With the above construction, unlike the conventional construction using an electromagnet, since a spring or the like is not used to return the bimorph element 1 to its initial position, no large force acts on the bimorph element 1 irrespective of the swinging direction of the bimorph element 1. Furthermore, since a lock mechanism is employed wherein the lever member 122 having the blocking piece 122c facing the coin guide 102 is selectively locked by the lock portion 123a of the bimorph element 1, the displacement required for the bimorph element 1 can be minimized. A force acting on the bimorph element 1 through the lock portion 123a when the coin abuts against the lever mechanism and drops comprises only a longitudinal tension component which presents no problem of mechanical strength. No force acts on the bimorph element 1 when the coin passes. In addition, when the lever 122 returns to its initial position by the restoration mechanism such as a return spring, no force generated by the bimorph element 1 is required. The bimorph element 1 can generate only a small force. The bimorph element 1 generally requires low drive power and can perform low-power coin processing in addition to the effect described above. Furthermore, no large force acts on the bimorph element 1 during coin processing. Fatigue of the bimorph element 1 is thus small, resulting in high reliability. A large force can be generated by the bimorph element 1 when a voltage is applied thereto so as to displace the bimorph element 1 in an opposite direction. Therefore, the opening/closing operation of the blocking piece 122c of the lever member 122 can be quickly controlled.

FIG. 27 shows still another embodiment wherein the present invention is applied to another coin processing apparatus. In this embodiment, a subsequent coin rolling stop arm mechanism and an opening/closing arm mechanism are formed integrally to constitute an escape mechanism 160. The resultant assembly is driven by a bimorph element 1 so as to drop coins one by one toward the coin guide.

Figure 28:
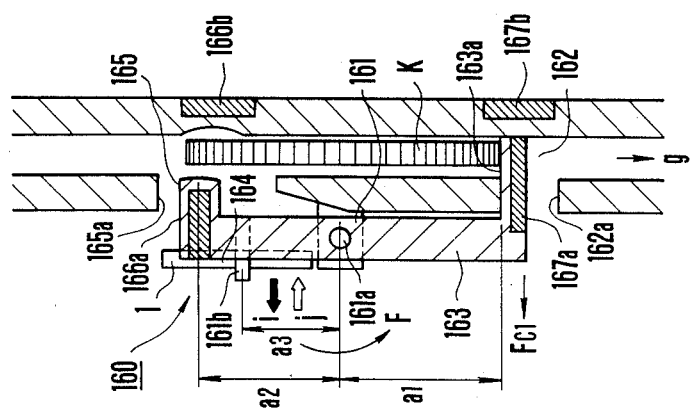

An escape mechanism 160 has a substantially U-shaped escape 161 which is pivotally supported by a shaft 161a, as shown in FIG. 28. The escape 161 is pivoted by the bimorph element 1 through an engaging portion 161b as a driving force transmission mechanism. A blocking plate 163a of an opening/closing arm mechanism for opening/closing a coin drop port 162 is integrally formed with a lower end of the escape 161. A subsequent coin rolling stop pin 165 is integrally formed with the upper end of the escape 161 through an arm 164. Reference numeral 165a denotes a window for moving the pin 165 in the guide; and 166a and 166b, and 167a and 167b, permanent magnets mounted on the pin 165 and the blocking plate 163a, and on the opposing guide plate, respectively.

Figure 30A:
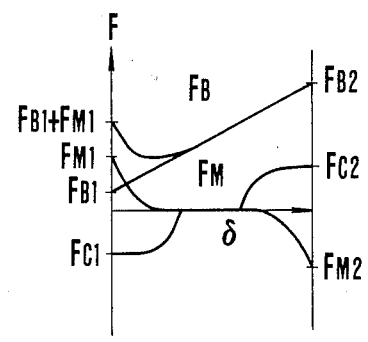

With this construction, the bimorph element 1 is normally displaced in the i direction to sequentially store the coins in the coin guide. In this state, the escape mechanism 160 receives a force for withdrawing the blocking piece by the weight of the coin K and a force for preventing rotation of the blocking plate 163a due to a frictional force between the coin and the blocking plate 163a. In this embodiment, since an arm 163 of the opening/closing arm mechanism is short, the rotational force becomes larger than the frictional force $F_{C1}$. As a result, the force $F_{C1}$ shown in FIG. 30A acts on the opening/closing arm mechanism clockwise. The displacement and generating force characteristics of the bimorph element 1 are indicated by $F_B$. The force $F_B$ becomes smaller than the force $F_{C1}$ at the displacement near-end position of the bimorph element 1, so that the escape mechanism 160 is moved back until the forces are balanced. This is because the opening/closing mechanism 163 for minimizing the effective angular displacement of the escape mechanism 160 degrades stability when a coin is supported. As previously mentioned, a magnet mechanism consisting of 167a and 167b (magnets or a combination of a magnet and a magnetic member) are used to resolve the above problem. The attraction property of the magnet mechanism is represented by a force $F_M$. In this embodiment, the respective components are set to satisfy inequality $F_{B1}+F_{M1}>F_{C1}$, so that the coin can be properly supported. When condition $F_{M1}>F_{C1}$ is established, a voltage need not be applied to the bimorph element 1.

Figure 29:
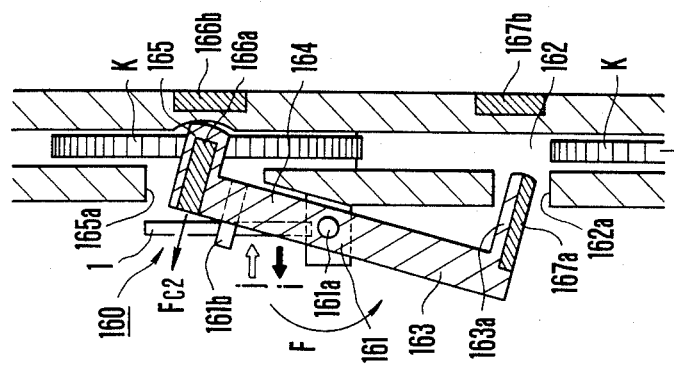
FIGS. 28 and 29 are respectively sectional views of the main part of the actuator in FIG. 27.
Figure 30B:
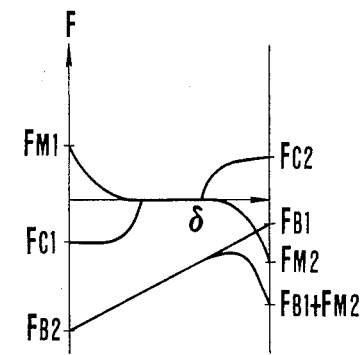

With the above construction, when a voltage is applied to the bimorph element 1 such that a displacement along the j direction occurs, a large clockwise force acts on the escape mechanism 160 which is then rotated against the attraction force of the magnet mechanism, as shown in FIG. 30B. The coin K is dropped, as shown in FIG. 29. Even if the opening/closing plate 163 is fixed by the magnet mechanism 167 in the vicinity of the displacement near-end position of the bimorph element 1, proper operation can be obtained when the coin drops.

Figure 31A:
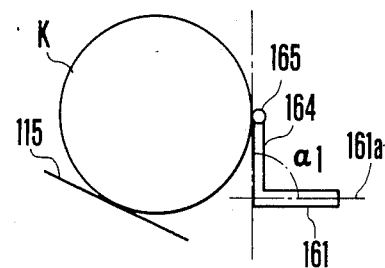
FIGS. 31A to 31C are respectively schematic views showing the relationship between an escape mechanism in FIG. 27 and coin processing.

With the above construction, coins are sequentially dropped one by one from the distal end coin upon operation of the escape mechanism 160. At the same time, the stop pin 165 integrally formed with the escape 161 prevents rolling of the subsequent coin. The insertion angle of the pin 165 and the force acting on the escape mechanism 160 will be briefly described. As shown in FIG. 31A, when the shaft 161*a* is perpendicular to a tangent of the coin when the pin 165 is inserted, no rotational force acts on the escape mechanism 160. Therefore, in order to pull the pin 165 held in the state in FIG. 29, a force generated by the bimorph element upon polarity switching must be constantly larger than the frictional force between the coin and the pin 165.

Figure 31B:
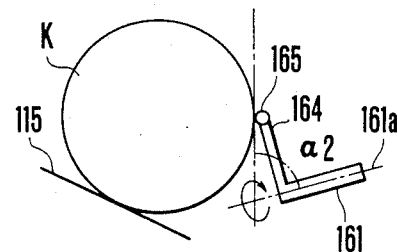

As shown in FIG. 31B, when an angle $\alpha 2$ is an acute angle, a force for rotating the pin 165 which extends into the coin guide is supplied by weight of a coin, so that the pin 165 is not easily withdrawn as compared with the case wherein the angle $\alpha 2$ is the right angle. However, in either case, when a voltage is applied to the bimorph element 1 such that the element 1 is displaced in the i direction, a large force is generated. Therefore, unless the angle $\alpha 2$ is extremely small, the pin 165 can be withdrawn.

Figure 31C:
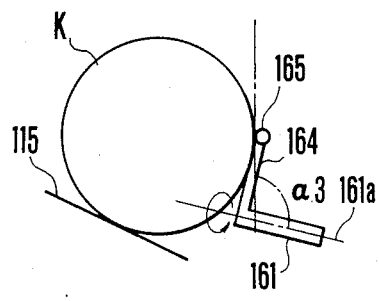

As shown in FIG. 31C, when an angle $\alpha 3$ becomes an obtuse angle, the coin weight serves to withdraw the pin 165. In this case, when the number of subsequent coins is increased, the escape mechanism 160 may be pivoted in the direction indicated by the arrow against a frictional force between the coin and the pin 165 and a force of the bimorph element 1 along the j direction. A relationship between the forces at this point is illustrated in FIG. 30B. Reference symbol $F_{C2}$ denotes a force obtained by subtracting the frictional force from a pin withdrawal force; and $F_{B1}$, a force of the bimorph element 1 along the j direction in the vicinity of the displacement near-end position. In order to prevent unstable operation of the pin 165, it is effective to use the same magnet mechanism as in the portion of the blocking plate 163*a*. The attraction characteristics of the magnet mechanism are represented by the force $F_{M2}$, as shown in FIG. 30B. When condition $F_{B1}+F_{M2}>F_{C2}$ is established, the subsequent coin can be completely stopped. Furthermore, when $F_{M2}>F_{C2}$ is established, a voltage can be withdrawn from the bimorph element 1.

When a voltage is applied to the bimorph element 1 so as to displace the element 1 in the i direction again, the large force $F_{B2}$ shown in FIG. 30B is generated, and the pin 165 is withdrawn. The blocking plate 163 is held in the blocking state, the subsequent coin rolls to become a leading coin. In this manner, the coins can drop one by one.

As shown in FIG. 27, a line O—O connecting the gravity points of the leading coin and the subsequent coin becomes preferably parallel to the downstream portion of the coin guide 115 so as to prevent upward movement when the second coin abuts against the first coin. Ratios of a length a1 to a3, and a length a2 to a length a3 can be properly selected to amplify the displacement of the bimorph element 1. Referring to FIG. 27, the escape mechanism 160 is directly controlled by the bimorph element. However, the escape mechanism 160 may be controlled through a arm mechanism, a link mechanism or a lock mechanism.

In the above embodiment, by using the magnet mechanism, each arm mechanism has a dynamically stable point in the vicinity of the displacement end position.

Figure 32:
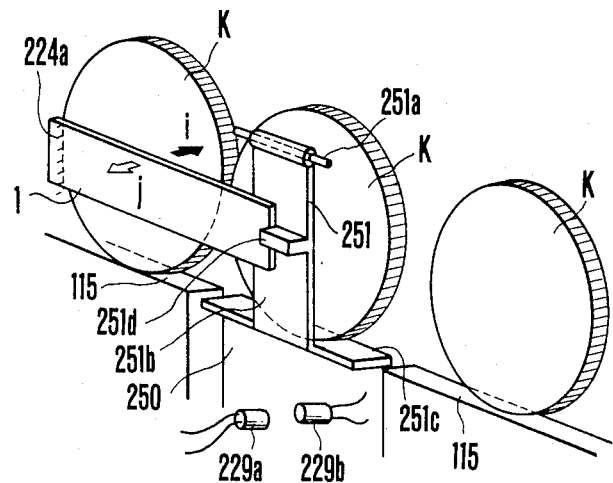
FIGS. 32 and 33 are respectively a perspective view and a side view of an arrangement wherein the piezoelectric actuator according to the present invention is applied to still another coin processing apparatus.
Figure 33:
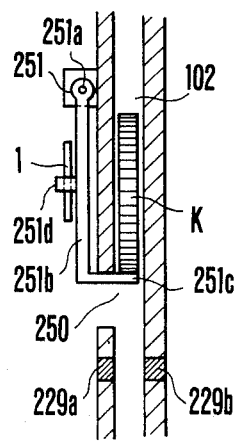

FIGS. 32 and 33 show still another embodiment of a coin processing apparatus according to the present invention. In this embodiment, the present invention is applied to a coin discrimination mechanism or coin drop mechanism. Referring to FIGS. 32 and 33, reference numeral 251 denotes an opening/closing arm mechanism which has a blocking plate 251*c* at the distal end of an arm 251*b*. This arm 251 is pivotally supported by a shaft 251*a* mounted along the coin guide 102. A U-shaped groove mechanism 251*d* is arranged in the arm 251*b* to couple to the bimorph element. The opening/closing arm mechanism 251 is pivoted upon swinging of the bimorph element 1.

With the above construction, when arrival of the coin is detected, the control circuit (reference numeral 5 in FIG. 1) is controlled to apply a voltage to the bimorph element 1 so as to hold the plate 251*c* in the opened/closed state. In this case, when the bimorph element 1 is held displaced in a direction indicated by arrow i, the blocking plate 251*c* at the lower end of the arm closes the drop port 250. The coin K passes on the plate 251*c* along the coin rail 115, as shown in FIG. 33. However, when the bimorph element 1 is displaced in a direction indicated by arrow j, the opening/closing arm 251 is pivoted in the opening direction, so that the coin K is dropped downward by its self weight from the drop port 250.

Figure 34:
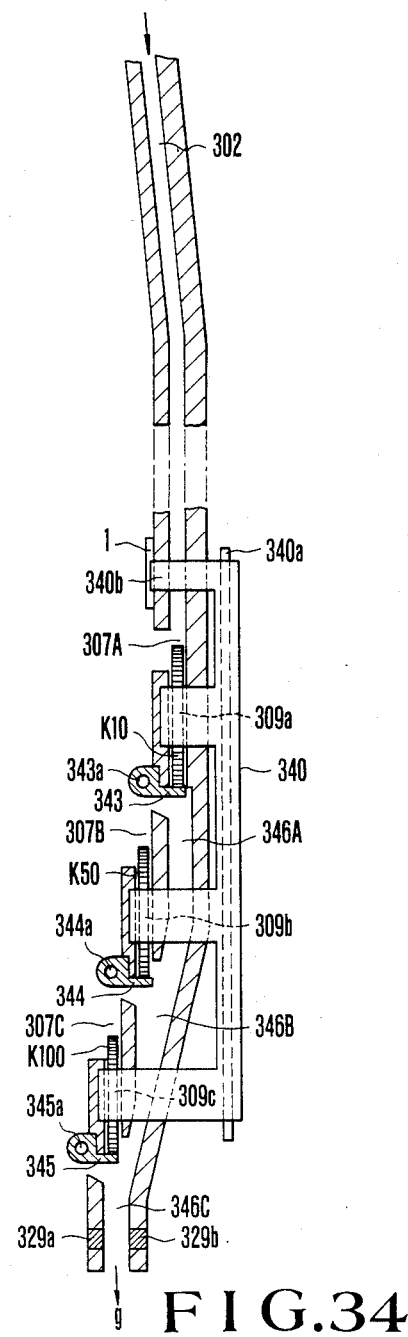
FIGS. 34 to 36 are respectively schematic views showing a construction wherein the piezoelectric actuator according to the present invention is applied to still another coin processing apparatus.
Figure 35:
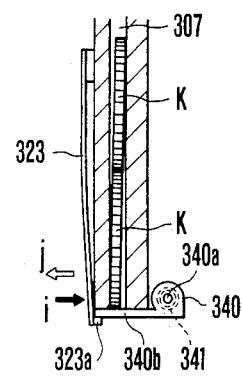
Figure 36:
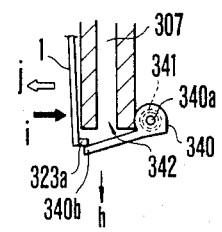

FIGS. 34 to 36 show still another embodiment of the present invention applied to a coin return mechanism. Referring to FIGS. 34 to 36, reference numeral 340 denotes a return door pivoted about a pivot shaft 340*a*. The door 340 is normally biased by a torsion coil spring 341 in a closed position in the same manner as the previous embodiment. An engaging piece 340*b* mounted at the upper end of the door 340 is selectively locked by a lock portion 323*a* constituting the lock mechanism at the distal end of the bimorph element 1. Coin dropping ports 342 formed at the terminals of coin storage guides 307A, 307B and 307C are closed by blocking pieces 309*a*, 309*b* and 309*c*, respectively.

With this construction, when the bimorph element 1 is held displaced in a direction indicated by arrow i, the conveyed coins K stopped by the locked door 340 are sequentially stored in the respective guides 307 (307A, 307B and 307C). When the polarity of the voltage applied to the bimorph element 1 is inverted, the bimorph element 1 is driven in a direction indicated by arrow j, and locking as described above is released, so that the door 340 is opened by the self weight of the coins K. As a result, the coins return to the return port through the coin return guides.

When the return state of the coin K is detected by a sensor 329, the polarity of the voltage applied to the bimorph element is inverted again. As a result, the door 340 is locked again.

In this embodiment, the bimorph element 1 is normally held displaced in the i direction to close the door 340. When the coin is returned, the bimorph element 1 is displaced in the opposite direction to open the door. When the coin is already returned, the bimorph element is displaced to close the door 340. When this mechanism is used in a public telephone set, a problem occurs. When a coin is inserted while the public telephone set is set in the on-hook state, i.e., while it is not used, the inserted coin is preferably returned without being stored in the guide 307. From this viewpoint, the lock mechanism constituted by the lock portion 323a must be rendered inoperative. For this purpose, the bimorph element 1 is normally held displaced in the j direction, thereby causing the telephone set in a coin return enable state. When the telephone is set in the off-hook state, i.e., when the telephone is used, a voltage is applied to the bimorph element which is then displaced in the i direction. The coin storage processing and the coin return operation at the end of conversation may be performed in accordance with the inversion of the voltage applied to the bimorph element 1.

The above-mentioned telephone set is often deenergized when it is held in the on-hook state. In this case, a magnet mechanism may be used. Alternatively, a capacitor may be arranged to charge it with a predetermined voltage, so that the bimorph element 1 can be applied with a proper voltage as needed.

Another method is proposed to open the door 430 when the telephone set is not used. After a coin is returned, the bimorph element 1 is displaced in the i direction before the door returns. As shown in FIG. 36, the lock mechanism may be arranged to be held in a mislocking state. In this case, when the telephone is used after the off-hook state, the bimorph element 1 is displaced in the j direction to close the door 340. Thereafter, the bimorph element 1 is then displaced in the i direction to restore the initial state. According to this control method, the bimorph element 1 is normally displaced in the i direction, and the door 340 is held in the open state. When the door is closed, i.e., when the coin storage processing is performed, the polarity inversion is performed twice to reciprocate the bimorph element 1. This operation can also be applied to the case wherein the door 340 is set in the open state, i.e., the normal state, in the same manner as described above.

In the above embodiment, a large force will not act on the swinging direction of the bimorph element 1. When the coin is returned, the bimorph element 1 must be displaced in the j direction against the frictional force generated with the door 340 at the lock mechanism of the distal end of the bimorph element 1. However, the bimorph element 1 generates a maximum force when the displacement direction is inverted. Therefore, the force generated by the bimorph element becomes larger than the frictional force, thereby releasing the locking state.

Reference 343, 344 and 345 denote storage levers which are pivotally supported by shafts 343a, 344a and 345a and which are mounted at the terminals of the storage guides 307A, 307B and 307C, respectively. Coin drop guides 346A, 346B and 346C for guiding the coins to the safe are located below the storage levers 343, 344 and 345.

Figure 37:
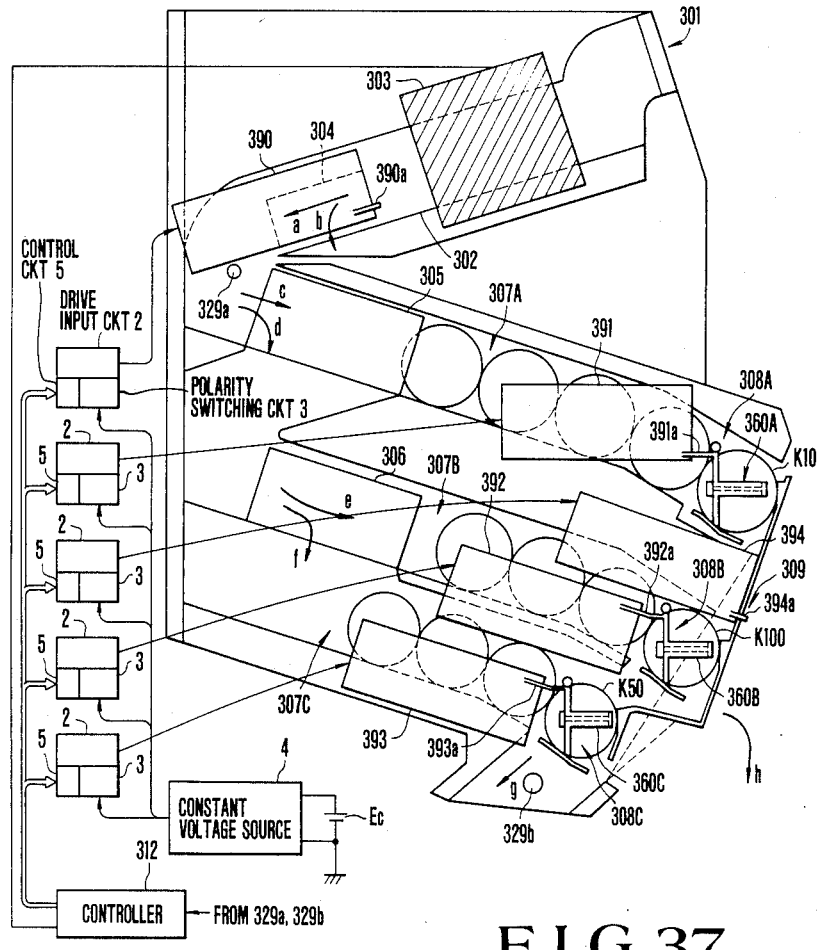
FIG. 37 is a schematic view showing a construction wherein the piezoelectric actuator according to the present invention is applied to still another coin processing apparatus.

FIG. 37 is an application example of a piezoelectric actuator using the bimorph element of the present invention. Referring to FIG. 37, the piezoelectric actuators are used in a discrimination mechanism 390, coin drop mechanisms 308A, 308B and 308C, and a coin return mechanism 309. The construction of the actuators and a circuit arrangement thereof have been sufficiently described, and a detailed description thereof will be omitted. Briefly speaking, piezoelectric actuator units each having a bimorph element are used in the discrimination mechanism 390 and the coin return mechanism 309 to drive lock mechanisms 390a, respectively. Piezoelectric actuator units each having a bimorph element are used in members 391a, 392a and 393a to drive escape mechanisms 360A to 360C to constitute the coin drop mechanisms 308A to 308C, respectively.

Referring to FIG. 37, reference numeral 301 denotes a coin insertion port; and 302, a coin guide for guiding coins K (K10, K100 and K50) inserted from the coin insertion port 301. A coin detector 303 is arranged midway on the coin guide 302 to detect an insertion state of the coin and whether or not the inserted coin is authentic (K10, K100, K50) in accordance with an outer diameter, a material and a thickness thereof. A discrimination mechanism 304 is arranged next to the coin detector 303 to discriminate counterfeit or unfit coins in accordance with the detection signal from the coin detector 303 and returns the counterfeit and unfit coins to the return port. Coin selector mechanisms 305 and 306 select the authentic coins K (K10, K100 and K50) discriminated by the discrimination mechanism 304 and guided along the coin guide 302. This selection operation is performed in units of denominations of the authentic coins. The selected coins are guided to the coin drop guides 307A, 307B and 307C in units of denominations. The coin drop mechanisms 308A, 308B and 308C are formed at terminal portions of the coin drop guides 307A, 307B and 307C, respectively. The coin return mechanism 309 is arranged at the terminals of the coin drop guides 307A, 307B and 307C. The coin drop mechanisms 308A, 308B and 308C drop the coins in the safe, and the coin return mechanism 309 returns the coins to the return port. In the above description, three types of coins K (K10, K100 and K50) are discriminated. Reference symbol K10 denotes a ¥10 coin; K100, a ¥100 coin; and K50, a ¥50 coin.

In the coin processing apparatus having the construction described above, the opening/closing of the discrimination mechanism 304 is controlled by a controller 312 operated in response to the output signal from the coin detector 303, and by a drive system (FIG. 1) consisting of the drive input circuit 2, the polarity switching circuit 3, the control circuit 5, the constant voltage circuit 4 and the power source $E_C$. Only the authentic coins K (K10, K100 and K50) among the inserted coins are guided along the coin guide 302 in the direction indicated by arrow a. As indicated by arrow b, counterfeit coins K0 are dropped from the coin guide 302 and are turned to the coin return port. In the same manner, authentic coins K (K10, K100 and K50) are selected in directions indicated by arrows c and d and arrows e and f by means of the coin selector mechanisms 305 and 306 under the control of the controller 312. The ¥10 coin K10 is guided in a first coin drop guide 307A, the ¥100 coin K100 is guided in a second coin drop guide 307B, and the ¥50 coin K50 is guided in a third coin drop guide 307C. The coins K (K10, K100 and K50) stored along the coin drop guides 307A, 307B and 307C drop by the coin drop mechanisms 308A, 308B and 308C one by one in the safe along the direction indicated by arrow g. The excessive coins are returned to the return port in the direction indicated by arrow h upon opening of the coin return mechanism 309 when the operation of main equipment having the coin processing apparatus is completed.

In this case, sensors 329a and 329b are arranged at the output sides of the discrimination mechanism 390 and the coin drop mechanisms 308A to 308C to detect passage of the coins. When the controller 312 detects operation of the sensors 329a and 329b, the polarity switching circuit 3 switches the polarity of the voltage through the control circuit 5.

The present invention is not limited to the embodiments described above. The shape and construction of the respective components can be arbitrarily changed and modified.

According to the present invention, the piezo element need not be limited to the piezoceramic element, but can be extended to a ferroelectric material such as a polymeric resin having a piezoelectric effect.

As described in detail, the present invention is applied to the coin processing apparatuses. However, the present invention may be used in a variety of applications so as to provide a drive unit for a known wire-dot printer head, a micropump of an ink-jet printer, a relay, an optical switch or the like.

The circuit shown in FIG. 1 generates a constant voltage. However, when the voltage $V_C$ changes without using the circuit in FIG. 1, a constant voltage circuit 4 in FIG. 38 may be inserted in parallel with an input circuit of the polarity switching circuit 3. In this case, a constant current diode CRD, the emitter-collector path of a PNP transistor Tr1, and the collector-emitter path of an NPN transistor Tr2 are connected in series with each other between a positive terminal F of the DC power source $E_C$ and the input side Ⓒ of the polarity switching circuit 3. A resistor R100 is connected between the bases of the transistors Tr1 and Tr2, and a Zener diode ZD4 is connected between the base of the transistor Tr2 and a terminal G.

The operation of the circuit having the arrangement described above will be described hereinafter. Assume that a voltage at a terminal C is higher than the voltage $V_C$ and varies. Also assume that the bimorph element 1 is charged, and that a potential across the input terminals C and G of the polarity switching circuit 3 is set at $V_C$. In this case, an emitter voltage at the NPN transistor Tr2 is the same as the base voltage, and thus the transistor Tr2 is kept OFF. A small current flows in the Zener diode ZD4 through the resistor R100 having a high resistance. When the polarity of the voltage is inverted, an input terminal voltage at the switching circuit 3 is decreased, and a current flows in the base of the transistor Tr2 to turn on the transistor Tr2. A charge current is supplied from the DC power source $E_C$ to the bimorph element 1 through the constant current diode CRD. When the input terminal voltage becomes $V_C$, the transistor Tr2 becomes OFF again. In this manner, the input terminal voltage is determined by $V_{ZD4}$. Even if the power source $E_C$ varies, a stable constant voltage can be obtained.

Figure 38:
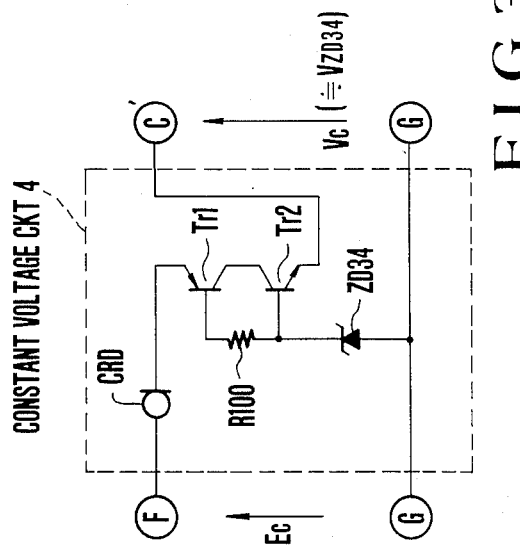
FIG. 38 is a circuit diagram showing another arrangement of a constant voltage circuit used in the piezoelectric actuator according to the present invention.

In FIG. 38, the transistors Tr1 and Tr2 may be replaced with Darlington-connected PNP and NPN transistors. In this case, a more stable voltage can be obtained with low power.

What is claimed is:

1. A piezoelectric actuator using a bimorph element, comprising:
   a bimorph element having at least one pair of piezo elements respectively on two surfaces of a central electrode and an electrode formed on a surface of each piezo element which is opposite to a surface contacting said central electrode, said piezo elements formed on the two surfaces of said central electrode being polarized in the same direction with respect to a direction of thickness of said bimorph element;
   a drive input circuit having a first and a second directional voltage limiting circuit, said first directional voltage limiting circuit having a first constant voltage diode, the anode of which is connected to one electrode contacting a positively polarized surface of the piezo element whose negatively polarized surface contacts said central electrode, and said second directional voltage limiting circuit having a second constant voltage diode, the anode of which is connected to the other electrode contacting a negatively polarized surface of the piezo element whose positively polarized surface contacts said central electrode, and wherein the anode of said first constant voltage diode and a cathode of said second constant voltage diode are commonly connected to constitute a first drive input terminal, and that said central electrode serves as a second drive input terminal;
   a constant voltage source for applying a constant voltage between said first and said second drive input terminals of said drive input circuit; and
   a polarity switching circuit, arranged between said constant voltage source and said drive input circuit for switching a polarity of said constant voltage source with respect to said first and second drive input terminals of said drive input circuit.

2. An actuator according to claim 1, wherein a plurality of piezo elements are formed on two surfaces of said central electrode, the number of piezo elements formed on one surface of said central electrode being the same as that on the other surface thereof, and the piezo elements formed on each surface of said central electrode being polarized in the same direction and being arranged such that every two adjacent piezo elements have opposing polarization directions, and electrodes of said plurality of piezo elements which are not connected to said first and second directional voltage limiting circuits are commonly connected to said second drive input terminal.

3. An actuator according to claim 1, wherein one end of said bimorph element is fixed, and an actuator mechanism is connected to a free end of said bimorph element.

4. An actuator according to claim 1, wherein said first and second constant voltage diodes are Zener diodes.

5. An actuator according to claim 1, wherein a power source voltage $V_C$ is set to be higher than the polarization degradation voltage $V_d$ of the piezo element, the power source voltage $V_C$ is applied across one piezo element in the same direction as the polarization direction, and a voltage $V_C - V_{ZD}$ is applied across the other piezo element to cause a depolarization effect in a direction opposite to the polarization direction, where $V_{DZ}$ is the voltage drop across said first and second constant voltage diodes.

6. An actuator according to claim 1, wherein the voltage applied in the direction opposite to the polarization direction by said first and second direction voltage limiting circuits has a value of at least the power source voltage $V_C$ minus 1/10 of the polarization breakdown voltage $V_p$ of said piezo elements.

7. An actuator according to claim 1, wherein each of said PNPN elements is turned on by a voltage applied upon a polarity inversion across said piezo elements.

8. An actuator according to claim 1, wherein said constant voltage source comprises a circuit for boosting a power source voltage $E_C$ to the constant voltage $V_C$, and said polarity switching circuit receives a ground level and the constant voltage $V_C$ and controls switching elements at the power source voltage or a voltage lower than the constant voltage $V_C$ so as to switch a polarity of the constant voltage $V_C$ and to apply the constant voltage to said drive input circuit.

9. An actuator according to claim 1, wherein said polarity switching circuit comprises a switching circuit obtained by bridging four transistors including two Darlington transistor pairs, one of two transistor pairs of said four transistors connected in parallel with each other or connected diagonally being held in an ON state in response to a control signal.

10. An actuator according to claim 1, wherein said polarity switching circuit comprises a switching circuit constituted by four bridge-connected thyristors operated in response to a pulse, one of two thyristor pairs of said four bridge-connected thyristors connected in parallel with each other or connected diagonally being held in an ON state in response to a control signal.

11. An actuator according to claim 1, having a constant current circuit connected between said constant voltage source and said drive input circuit.

12. An actuator according to claim 3, wherein said actuator mechanism comprises a pivot arm mechanism.

13. An actuator according to claim 3, further comprising a stopper for regulating swinging movement of said actuator mechanism within an allowable range.

14. An actuator according to claim 3, wherein a magnet mechanism comprises magnetic members which are respectively disposed in a vicinity of an operating end of said actuator mechanism and at a fixed portion in a vicinity of a displacement near-end position thereof, said magnetic members attracting each other.

15. An actuator according to claim 3, wherein said actuator mechanism controls a coin rolling along a coin guide of a coin processing apparatus.

16. An actuator according to claim 1, further comprising a stopper for regulating swinging movement of said bimorph element within an allowable range.

17. An actuator according to claim 1, wherein said central electrode comprises a magnetic material, and a magnet is arranged in a vicinity of a displacement near-end position of the free end of said bimorph element, said magnet being attracted to the free end when the free end comes closer thereto.

18. An actuator according to claim 1, wherein a surface of said bimorph element is coated with an insulating resin.

19. An actuator according to claim 18, wherein the insulating resin comprises a soft resin material and a hard resin material coated thereon.

20. An actuator according to claim 1, wherein said polarity switching circuit performs switching after said bimorph element is displaced in a predetermined direction and a predetermined operation is performed.

21. A piezoelectric actuator using a bimorph element, comprising:

a bimorph element having at least one pair of piezo elements respectively on two surfaces of a central electrode and an electrode formed on a surface of each piezo element which is opposite to a surface contacting said central electrode, said piezo elements formed on the two surfaces of said central electrode being polarized in the same direction with respect to a direction of thickness of said bimorph element;

a drive input circuit having a first and a second directional voltage limiting circuit, said first directional voltage limiting circuit having a first PNPN element, the anode of which is connected to one electrode contacting a positively polarized surface of the piezo element whose negatively polarized surface contacts said central electrode, and said second directional voltage limiting circuit having a second PNPN element, the cathode of which is connected to the other electrode contacting a negatively polarized surface of the piezo element whose positively polarized surface contacts said central electrode, said first and second PNPN elements are capable of being turned on at a predetermined voltage, and wherein the cathode of said first PNPN element and the anode of said second PNPN element are commonly connected to constitute one drive input terminal, and that said central electrode serves as the other input terminal;

a constant voltage source for applying a constant voltage between said one and said other drive input terminals; and a polarity switching circuit, arranged between said constant voltage source and said drive input circuit, for switching a polarity of said constant voltage source with respect to said one and said other drive input terminals of said drive input circuit.

* * * * *

UNITED STATES PATENT AND TRADEMARK OFFICE
CERTIFICATE OF CORRECTION

PATENT NO. : 4,625,137

DATED : November 25, 1986

INVENTOR(S) : Akira Tomono

It is certified that error appears in the above-identified patent and that said Letters Patent is hereby corrected as shown below:

Column 3, line 47, delete "limitating" and insert ---- limiting ----, same line, delete "displacemnet" and insert ---- displacement ----.

Column 4, line 7, after "view" insert ---- taken along lines IIXXX - IIXXX ----.

Column 4, line 9, delete "to 30C" and insert ---- and 30B ----.

Column 6, line 45, delete "T1" and insert ---- TR ----.

Column 7, line 14, after "on" insert a period ---- . ----.

Column 11, line 66, delete "21" and insert ---- 2 ----.

UNITED STATES PATENT AND TRADEMARK OFFICE
CERTIFICATE OF CORRECTION

PATENT NO. : 4,625,137
DATED : November 25, 1986
INVENTOR(S) : Akira Tomono

It is certified that error appears in the above-identified patent and that said Letters Patent is hereby corrected as shown below:

Column 16, line 29, after "level" insert a period ---- . ----.

Column 17, line 41, after "circuit" insert a period ---- . ----.

Column 21, line 1, delete "122" and insert ---- 121 ----.

Column 21, line 19, delete "122" and insert ---- 121 ----.

Column 21, line 20, delete "122" and insert ---- 121 ----.

Column 21, line 41, delete "127" and insert ---- 123a ----.

Column 23, line 3, delete "30B" and insert ---- 29 ----.

Column 23, line 58, delete "163" and insert ---- 163a ----.

UNITED STATES PATENT AND TRADEMARK OFFICE
CERTIFICATE OF CORRECTION

PATENT NO. : 4,625,137
DATED : November 25, 1986
INVENTOR(S) : Akira Tomono

It is certified that error appears in the above-identified patent and that said Letters Patent is hereby corrected as shown below:

Column 27, line 31, delete "$\text{\textcircled{C}}$" and insert ---- $\text{\textcircled{C'}}$ ----.

Column 28, line 8, delete "anode" and insert ---- cathode ----.

Column 28, line 39, after "and" insert ---- wherein ----.

Column 28, line 65, delete "1" and insert ---- 21 ----.

Column 30, line 40, after "other" insert ---- drive ----.

Signed and Sealed this

Thirtieth Day of August, 1988

Attest:

DONALD J. QUIGG

*Attesting Officer*      *Commissioner of Patents and Trademarks*